(12) United States Patent
Saito et al.

(10) Patent No.: US 12,742,047 B2
(45) **Date of Patent: *Sep. 22, 2026**

(54) RESIN COMPOSITION, PREPREG, RESIN-COATED FILM, RESIN-COATED METAL FOIL, METAL-CLADDED LAMINATE BOARD, AND WIRING BOARD

(71) Applicant: PANASONIC INTELLECTUAL PROPERTY MANAGEMENT CO., LTD., Osaka (JP)

(72) Inventors: Hirosuke Saito, Osaka (JP); Hiroaki Umehara, Fukushima (JP); Hiroharu Inoue, Osaka (JP); Rihoko Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 552 days.

This patent is subject to a terminal disclaimer.

(21) Appl. No.: 18/025,141

(22) PCT Filed: Sep. 9, 2021

(86) PCT No.: PCT/JP2021/033131

§ 371 (c)(1),
(2) Date: Mar. 7, 2023

(87) PCT Pub. No.: WO2022/054867

PCT Pub. Date: Mar. 17, 2022

(65) Prior Publication Data

US 2023/0331944 A1 Oct. 19, 2023

(30) Foreign Application Priority Data

Sep. 11, 2020 (JP) ................................ 2020-153181

(51) Int. Cl.
*C08J 5/24* (2006.01)
*C08F 257/02* (2006.01)
(Continued)

(52) U.S. Cl.
CPC ............ *C08J 5/244* (2021.05); *C08F 257/02* (2013.01); *C08F 290/062* (2013.01);
(Continued)

(58) Field of Classification Search
CPC ..... C08J 5/244; C08J 5/249; C08J 5/24; C08J 2351/05; C08J 2351/08; C08J 2451/06;
(Continued)

(56) References Cited

U.S. PATENT DOCUMENTS

2019/0016874 A1 1/2019 Hsieh
2019/0169432 A1 6/2019 Tonouchi et al.
(Continued)

FOREIGN PATENT DOCUMENTS

CN 109265996 A 1/2019
CN 113493617 A 10/2021
(Continued)

OTHER PUBLICATIONS

L. Wang et al., "Synthesis of Several soluble Maleimide Resins", New Chemical Materials vol. 7, pp. 22-25, Jul. 31, 1996, partial translation.
(Continued)

*Primary Examiner* — Camie S Thompson
(74) *Attorney, Agent, or Firm* — GREENBLUM & BERNSTEIN, P.L.C.

(57) ABSTRACT

A resin composition contains a maleimide compound (A) that has a maleimide equivalent of 500 g/eq. or less, is solid at 25° C., and dissolves at one or more concentration in a range of 40% by mass or more and less than 100% by mass as a concentration of the maleimide compound in a mixture
(Continued)

of at least one selected from the group consisting of toluene and methyl ethyl ketone and the maleimide compound at 25° C.; and a polymerizable compound (B) having a carbon-carbon unsaturated double bond in a molecule and a proportion of a total mass of heteroatoms to a total mass of all constituent elements of 15% by mass or less.

23 Claims, 5 Drawing Sheets

(51) Int. Cl.
*C08F 290/06* (2006.01)
*C08K 3/36* (2006.01)
*H05K 1/03* (2006.01)

(52) U.S. Cl.
CPC ................ *C08J 5/249* (2021.05); *C08K 3/36* (2013.01); *H05K 1/0346* (2013.01); *H05K 1/0366* (2013.01); *C08J 2351/06* (2013.01); *C08J 2351/08* (2013.01)

(58) Field of Classification Search
CPC ........ C08J 2451/08; C08K 3/013; C08K 3/36; B32B 15/14; B32B 15/088; B32B 15/08; B32B 2260/021; B32B 2260/046; C08F 122/40; C08F 212/08; C08F 222/40; C08F 257/02; C08F 290/062; H05K 1/0346; H05K 1/0366; H05K 2201/068; C08L 101/02; C08L 71/12; C08L 63/00; C08G 23/29; C08G 65/485
USPC ...................................................... 428/292.1
See application file for complete search history.

(56) References Cited

U.S. PATENT DOCUMENTS

| | | | | |
|---|---|---|---|---|
| 2021/0214547 | A1 | 7/2021 | Honda et al. | |
| 2021/0261736 | A1 | 8/2021 | Kuboki et al. | |
| 2023/0323000 | A1* | 10/2023 | Umehara | C08J 5/18 |

FOREIGN PATENT DOCUMENTS

| | | | |
|---|---|---|---|
| JP | 2019-035036 | A | 3/2019 |
| JP | 2021-161325 | A | 10/2021 |
| TW | 202012486 | A | 4/2020 |
| WO | 2017/209108 | A1 | 12/2017 |
| WO | 2019/230945 | A1 | 12/2019 |
| WO | 2020/004211 | A1 | 1/2020 |
| WO | 2020/175538 | A1 | 9/2020 |
| WO | 2020/217677 | A1 | 10/2020 |

OTHER PUBLICATIONS

ISR issued in International Patent Application No. PCT/JP2021/033131, Nov. 16, 2021, translation.

"Maleimide, Curable Resin Composition, And Cured Product", Technical Disclosure of the Invention Promotion Association No. 2020-500211, issued on Feb. 21, 2020, published by Japan Institute for Promoting Invention and Innovation; translation.

Zeng et al., "A facile method to fabricate thermally stable methacrylate-terminated oligo(2,6-dimethyl-1,4-phenylene oxide)/benzoxazine thermosetting resins with low dielectric constants and losses at 10GHz", A Journal of Applied Polymer Science vol.140, Issue 38, Jul. 14, 2023, URL: https://doi.org/10.1002/app.54421.

* cited by examiner

RESIN COMPOSITION, PREPREG, RESIN-COATED FILM, RESIN-COATED METAL FOIL, METAL-CLADDED LAMINATE BOARD, AND WIRING BOARD

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multilayering are progressing. In addition, wiring boards used in various kinds of electronic equipment are required to be, for example, high-frequency compatible wiring boards such as a millimeter-wave radar board for in-vehicle use. Substrate materials for forming insulating layers of wiring boards used in various kinds of electronic equipment are required to have a low relative dielectric constant and a low dielectric loss tangent in order to increase the signal transmission speed and to decrease the signal transmission loss. Examples of such substrate materials include resin compositions containing thermoplastic elastomers.

Molding materials such as substrate materials are required to exhibit not only excellent low dielectric properties but also excellent heat resistance and the like. For this reason, it is conceivable to use maleimide resins, which are known to exhibit high heat resistance, as a substrate material.

Examples of resin compositions containing such maleimide resins and thermoplastic elastomers include a resin composition described in Patent Literature 1. Patent Literature 1 describes a thermosetting resin composition containing an addition reaction product of a maleimide compound and an amine compound, a thermoplastic elastomer, and a copolymer resin having a structural unit derived from a carboxylic anhydride such as a structural unit derived from a maleic anhydride and a structural unit derived from an aromatic vinyl compound. Patent Literature 1 discloses that a thermosetting resin composition exhibiting excellent heat resistance, low thermal expansion properties, a low dielectric constant and a low dielectric loss tangent is obtained.

Metal-clad laminates and metal foils with resin used in the manufacture of wiring boards and the like include not only an insulating layer but also a metal foil on the insulating layer. Wiring boards also include not only an insulating layer but also wiring on the insulating layer. Examples of the wiring include wiring derived from a metal foil equipped in the metal-clad laminate or the like.

In recent years, printed circuit boards (PCBs) are becoming less and less different from semiconductor package substrates (PKGs), as typified by substrate-like PCBs. In electronic devices, particularly in small portable devices such as portable communication terminals and notebook PCs, multifunctionalization, improvement in performance, thinning, and miniaturization have rapidly proceeded and information communication speeds have also been remarkably improved. Along with this, in substrates such as PCBs and PKGs that are equipped in these products as well, there is a further demand for miniaturization of conductor wiring, multilayering of conductor wiring layers, thinning, and improvement in performance such as mechanical properties.

Wiring boards and the like used in various kinds of electronic equipment are also required to be hardly affected by reflow and the like during mounting. Substrate materials for forming insulating layers of wiring boards are required to afford cured products exhibiting superior heat resistance such as a high glass transition temperature so that the wiring boards can be used without problems, for example, after subjected to reflow processing as well. It is also required that insulating layers equipped in wiring board are not deformed by reflow or the like. Since this deformation is suppressed when the glass transition temperature of the insulating layers is high, the substrate materials for forming insulating layers of wiring boards are required to afford cured products exhibiting superior heat resistance such as a high glass transition temperature. As thinning of wiring boards proceeds, problems arise that warping of semiconductor packages in which semiconductor chips are mounted on wiring boards occurs and mounting failures are likely to occur. In order to suppress warping of semiconductor packages in which semiconductor chips are mounted on wiring boards, the insulating layers are required to have a low coefficient of thermal expansion. Hence, substrate materials for forming insulating layers of wiring boards are required to afford cured products having low coefficients of thermal expansion. Furthermore, in order to suppress loss due to increased resistance accompanying miniaturization of wiring, the insulating layers equipped in wiring boards are further required to exhibit low dielectric properties. For these reasons, substrate materials of wiring boards and the like are required to exhibit lower dielectric properties than the resin composition described in Patent Literature 1 in order to respond to high frequencies, and are further required to exhibit both excellent heat resistance and a low coefficient of thermal expansion.

CITATION LIST

Patent Literature

Patent Literature 1: WO 2017/209108 A

SUMMARY OF INVENTION

The present invention has been made in view of such circumstances, and an object thereof is to provide a resin composition, which affords a cured product exhibiting excellent low dielectric properties and heat resistance and a low coefficient of thermal expansion. Another object of the present invention is to provide a prepreg, a film with resin, a metal foil with resin, a metal-clad laminate, and a wiring board, which are obtained using the resin composition.

An aspect of the present invention is a resin composition containing a maleimide compound (A) that has a maleimide equivalent of 500 g/eq. or less, is solid at 25° C., and dissolves at one or more concentration in a range of 40% by mass or more and less than 100% by mass as a concentration of the maleimide compound in a mixture of at least one selected from the group consisting of toluene and methyl ethyl ketone and the maleimide compound at 25° C.; and a polymerizable compound (B) having a carbon-carbon unsaturated double bond in a molecule and a proportion of a total mass of heteroatoms to a total mass of all constituent elements of 15% by mass or less.

DESCRIPTION OF EMBODIMENTS

Figure 1:
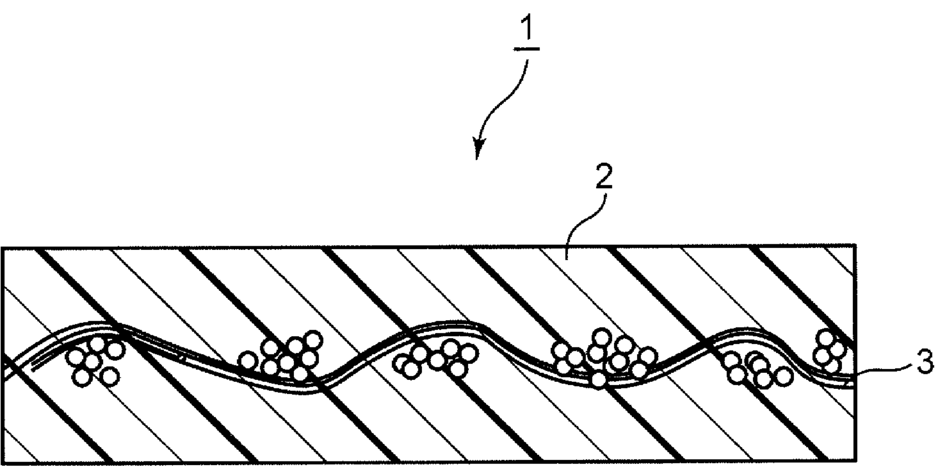
FIG. 1 is a schematic sectional view illustrating an example of a prepreg according to an embodiment of the present invention.

The present inventors have found out that the objects are achieved by the present invention described below as a result of extensive studies.

Hereinafter, embodiments according to the present invention will be described, but the present invention is not limited thereto.

[Resin Composition]

The resin composition according to the present embodiment is a resin composition containing a maleimide compound (A) that has a maleimide equivalent of 500 g/eq. or less, is solid at 25° C., and dissolves at one or more concentration in a range of 40% by mass or more and less than 100% by mass as a concentration of the maleimide compound in a mixture of at least one selected from the group consisting of toluene and methyl ethyl ketone and the maleimide compound at 25° C.; and a polymerizable compound (B) having a carbon-carbon unsaturated double bond in a molecule and a proportion of a total mass of heteroatoms to a total mass of all constituent elements of 15% by mass or less. By curing the resin composition having such a configuration, a cured product is obtained which exhibits excellent low dielectric properties and heat resistance and a low coefficient of thermal expansion.

Since the maleimide compound (A) has a maleimide equivalent of 500 g/eq. or less and is solid at 25° C., in the resin composition, it is considered that the high glass transition temperature of the maleimide compound (A) can be maintained and the heat resistance can be enhanced by curing the polymerizable compound (B) together with the maleimide compound (A). It is considered that the resin composition affords a cured product exhibiting excellent low dielectric properties by curing the polymerizable compound (B) together with the maleimide compound (A). Since the maleimide compound (A) dissolves at one or more concentration in a range of 40% by mass or more and less than 100% by mass as the concentration of the maleimide compound (A) in a mixture of at least one selected from the group consisting of toluene and methyl ethyl ketone and the maleimide compound at 25° C., it is considered that, for example, the resin composition is easily dissolved in these solvents to form a varnish, the maleimide compound (A) and the polymerizable compound (B) are suitably dispersed when the resin composition is formed into a varnish, and a suitable cured product is obtained. As the resin composition contains the maleimide compound (A) and the polymerizable compound (B), it is considered that the sedimentation of inorganic filler can be suppressed in the case of containing an inorganic filler as well. Since the resin composition can be suitably cured, it is considered that the heat resistance and coefficient of thermal expansion of the cured product obtained can be decreased. From these facts, it is considered that the resin composition affords a cured product, which exhibits excellent low dielectric properties and heat resistance and a low coefficient of thermal expansion.

(Maleimide Compound (A))

The maleimide compound (A) is not particularly limited as long as it is a maleimide compound that has a maleimide equivalent of 500 g/eq. or less, is solid at 25° C., and dissolves at one or more concentration in a range of 40% by mass or more and less than 100% by mass as the concentration of the maleimide compound in a mixture of at least one selected from the group consisting of toluene and methyl ethyl ketone and the maleimide compound at 25° C.

The maleimide equivalent of the maleimide compound (A) is 500 g/eq. or less, preferably 150 to 500 g/eq., more preferably 150 to 450 g/eq. When the maleimide equivalent is too high, the cured product obtained tends to have a low glass transition temperature and low heat resistance. Hence, since the maleimide compound (A) has a maleimide equivalent in the above range and is solid at 25° C., in the resin composition, it is considered that the high glass transition temperature of the maleimide compound (A) can be maintained and the heat resistance can be enhanced by curing the polymerizable compound (B) together with the maleimide compound (A).

The maleimide compound (A) dissolves at one or more concentration in a range of 40% by mass or more and less than 100% by mass as the concentration of the maleimide compound (A) in a mixture of at least one (solvent) selected from the group consisting of toluene and methyl ethyl ketone and the maleimide compound (A) at 25° C. In other words, with regard to the maleimide compound (A), the concentration of the maleimide compound (A) in the mixture is 40% by mass or more and less than 100% by mass when the maleimide compound (A) dissolves in a mixture obtained by mixing the maleimide compound (A) and the solvent at 25° C.

The mixing is not particularly limited as long as it is a condition (for example, the concentration is a concentration at which the maleimide compound (A) can dissolve) under which dissolution is possible and it is mixing by which the maleimide compound (A) dissolves, and examples thereof include stirring. The mixing conditions are not also particularly limited, and in the case of stirring, the stirring time may be, for example, 10 to 120 minutes. As the solvent constituting the mixture, toluene may be used singly, methyl ethyl ketone may be used singly, or a mixed solvent of toluene and methyl ethyl ketone may be used. Here, dissolution is a state in which the solvent and the maleimide compound (A) are mixed to form a uniform liquid phase (solution), and includes, for example, a state in which precipitates, suspended substances and the like are not visually observed in the finally obtained mixture and the mixture is visually recognized to be transparent. In a case where the synthesis of the maleimide compound (A) is performed in the solvent and the solution after the maleimide compound (A) has been produced has a concentration in the above concentration range, when a state in which precipitates, suspended substances and the like are not visually observed in the liquid obtained after the reaction and the liquid is visually recognized to be transparent is maintained even after the liquid has been left at 25° C. for a long period of time, for example, one week, this state is also dissolution (a state in which the maleimide compound (A) is dissolved in the solvent).

The concentration (concentration of the maleimide compound (A) soluble in the mixture at 25° C.) is 40% by mass or more and less than 100% by mass as described above, and is preferably 50% by mass or more and less than 100% by mass. In the case of a maleimide compound of which the concentration described above is too low, there is a tendency that the resin composition is unlikely to be formed into a varnish and a suitable cured product is unlikely to be obtained. Hence, in the case of a maleimide compound of which the concentration described above is in the above range, for example, the resin composition is easily dissolved in these solvents to form a varnish, the maleimide compound (A) and the polymerizable compound (B) are suitably dispersed when the resin composition is formed into a varnish, and a suitable cured product is obtained. Since the resin composition can be suitably cured, the heat resistance and coefficient of thermal expansion of the cured product obtained can be decreased.

Examples of the maleimide compound (A) include a maleimide compound (A1) having an arylene structure bonded in the meta-orientation in the molecule and a maleimide compound (A2) having an indane structure in the molecule. As the maleimide compound, one of these may be used, or these two may be used in combination.

The maleimide compound (A1) having an arylene structure bonded in the meta-orientation in the molecule is not particularly limited as long as it is a maleimide compound having an arylene structure bonded in the meta-orientation in the molecule. Examples of the arylene structure bonded in the meta-orientation include an arylene structure in which a structure containing a maleimide group is bonded at the meta position (an arylene structure in which a structure containing a maleimide group is substituted at the meta position). The arylene structure bonded in the meta-orientation is an arylene group bonded in the meta-orientation, such as a group represented by the following Formula (9). Examples of the arylene structure bonded in the meta-orientation include m-arylene groups such as a m-phenylene group and a m-naphthylene group, and more specific examples thereof include a group represented by the following Formula (9).

[Chem. 1]

(9)

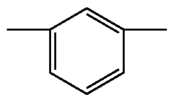

Examples of the maleimide compound (A1) having an arylene structure bonded in the meta-orientation in the molecule include a maleimide compound (A3) represented by the following Formula (3), and more specific examples thereof include a maleimide compound (A4) represented by the following Formula (4).

[Chem. 2]

(3)

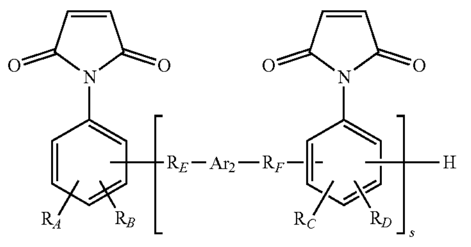

In Formula (3), Are represents an arylene group bonded in the meta-orientation. $R_A$, $R_B$, $R_C$, and $R_D$ are independent of each other. In other words, $R_A$, $R_B$, $R_C$, and $R_D$ may be the same group as or different groups from each other. $R_A$, $R_B$, $R_C$, and $R_D$ represent a hydrogen atom, an alkyl group having 1 to 5 carbon atoms, or a phenyl group, preferably a hydrogen atom. $R_E$ and $R_F$ are independent of each other. In other words, $R_E$ and $R_F$ may be the same group as or different groups from each other. $R_E$ and $R_F$ represent an aliphatic hydrocarbon group. s represents 1 to 5.

The arylene group is not particularly limited as long as it is an arylene group bonded in the meta-orientation, examples thereof include m-arylene groups such as a m-phenylene group and a m-naphthylene group, and more specific examples thereof include a group represented by Formula (9).

Examples of the alkyl group having 1 to 5 carbon atoms include a methyl group, an ethyl group, a propyl group, an isopropyl group, a n-butyl group, a sec-butyl group, an isobutyl group, a tert-butyl group, a pentyl group, and a neopentyl group.

The aliphatic hydrocarbon group is a divalent group and may be acyclic or cyclic. Examples of the aliphatic hydrocarbon group include an alkylene group, and more specific examples thereof include a methylene group, a methylmethylene group, and a dimethylmethylene group. Among these, a dimethylmethylene group is preferable.

In the maleimide compound (A3) represented by Formula (3), s, which is the number of repetitions, is preferably 1 to 5. This s is the average value of the number of repetitions (degree of polymerization).

[Chem. 3]

(4)

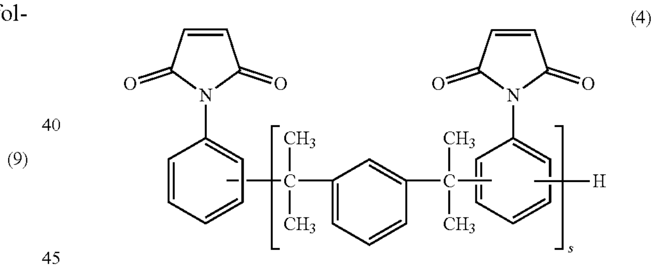

In Formula (4), s represents 1 to 5. This s is the same as s in Formula (3) and is the average value of the number of repetitions (degree of polymerization).

As long as s, which is the average value of the number of repetitions (degree of polymerization), is 1 to 5, the maleimide compound (A3) represented by Formula (3) and the maleimide compound (A4) represented by Formula (4) may include a monofunctional form in which s is 0 or a polyfunctional form such as a heptafunctional form or an octafunctional form in which s is 6 or more.

As the maleimide compound (A1) having an arylene structure bonded in the meta-orientation in the molecule, a commercially available product can be used, and for example, the solid component in MIR-5000-60T manufactured by Nippon Kayaku Co., Ltd. may be used.

As the maleimide compound (A1) having an arylene structure bonded in the meta-orientation in the molecule, the maleimide compounds exemplified above may be used singly or in combination of two or more kinds thereof. As the maleimide compound, the maleimide compound (A3) represented by Formula (3) may be used singly or the maleimide compound (A3) represented by Formula (3) may be used in combination of two or more kinds thereof. Examples of the combined use of two or more kinds of the maleimide compound (A3) represented by Formula (3) include concurrent use of the maleimide compound (A3) represented by Formula (3) other than the maleimide compound (A4) represented by Formula (4) with the maleimide compound (A4) represented by Formula (4).

The maleimide compound (A2) having an indane structure in the molecule is not particularly limited as long as it is a maleimide compound having an indane structure in the molecule. Examples of the indane structure include a divalent group obtained by eliminating two hydrogen atoms from indane or indane substituted with a substituent, and more specific examples thereof include a structure represented by the following Formula (5). The maleimide compound (A2) having an indane structure in the molecule also has a maleimide group in the molecule. Examples of the maleimide compound (A2) having an indane structure in the molecule include a maleimide compound having a structure represented by the following Formula (5) in the molecule, and more specific examples thereof include a maleimide compound (A5) having a structure represented by the following Formula (6) in the molecule.

[Chem. 4]

(5)

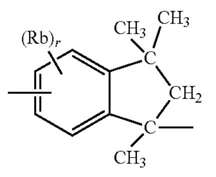

In Formula (5), "Rb"s are independent of each other. In other words, "Rb"s may be the same group as or different groups from each other, and for example, when r is 2 or 3, two or three "Rb"s bonded to the same benzene ring may be the same group as or different groups from each other. "Rb" represents an alkyl group having 1 to 10 carbon atoms, an alkyloxy group (alkoxy group) having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a hydroxyl group, or a mercapto group (thiol group). r represents 0 to 3.

[Chem. 5]

(6)

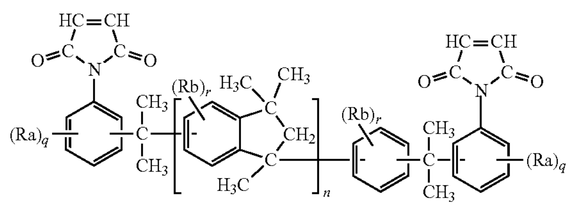

In Formula (6), "Ra"s are independent of each other. In other words, "Ra"s may be the same group as or different groups from each other, and for example, when q is 2 to 4, two to four "Ra"s bonded to the same benzene ring may be the same group as or different groups from each other. "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. "Rb" is the same as "Rb" in Formula (5), and "Rb"s each independently represent an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. q represents 0 to 4. r represents 0 to 3. n represents 0.95 to 10.

r is the average value of the degree of substitution of "Rb", it is more preferable as r is smaller, and specifically, r is preferably 0. In other words, in the benzene ring to which "Rb" may be bonded, it is preferable that a hydrogen atom is bonded to the position to which "Rb" may be bonded. It is easy to synthesize the maleimide compound (A2) having an indane structure in the molecule and such r. It is considered that this is because steric hindrance is diminished and the electron density in the aromatic ring increases. When r is 1 to 3, "Rb" is preferably at least one selected from the group consisting of an alkyl group having 1 to 4 carbon atoms, a cycloalkyl group having 3 to 6 carbon atoms, and an aryl group having 6 to 10 carbon atoms among the above. "Ra" is preferably at least one selected from the group consisting of an alkyl group having 1 to 4 carbon atoms, a cycloalkyl group having 3 to 6 carbon atoms, and an aryl group having 6 to 10 carbon atoms among the above. As "Ra" and "Rb" are an alkyl group having 1 to 4 carbon atoms, a cycloalkyl group having 3 to 6 carbon atoms, or an aryl group having 6 to 10 carbon atoms, it is easy to dissolve the maleimide compound (A2) in a solvent as well as a decrease in reactivity of the maleimide group can be suppressed and a suitable cured product is obtained. It is considered that this is due to a decrease in planarity in the vicinity of the maleimide group, a decrease in crystallinity, and the like.

Specific examples of the groups represented by "Ra" and "Rb" include the following groups.

The alkyl group having 1 to 10 carbon atoms is not particularly limited, and examples thereof include a methyl group, an ethyl group, a propyl group, a hexyl group and a decyl group.

The alkyloxy group having 1 to 10 carbon atoms is not particularly limited, and examples thereof include a methyloxy group, an ethyloxy group, a propyloxy group, a hexyloxy group and a decyloxy group.

The alkylthio group having 1 to 10 carbon atoms is not particularly limited, and examples thereof include a methylthio group, an ethylthio group, a propylthio group, a hexylthio group and a decylthio group.

The aryl group having 6 to 10 carbon atoms is not particularly limited, and examples thereof include a phenyl group and a naphthyl group.

The aryloxy group having 6 to 10 carbon atoms is not particularly limited, and examples thereof include a phenyloxy group and a naphthyloxy group.

The arylthio group having 6 to 10 carbon atoms is not particularly limited, and examples thereof include a phenylthio group and a naphthylthio group.

The cycloalkyl group having 3 to 10 carbon atoms is not particularly limited, and examples thereof include a cyclopropyl group, a cyclobutyl group, a cyclohexyl group, and a cyclooctyl group.

Examples of the halogen atom include a fluorine atom, a chlorine atom, a bromine atom, and an iodine atom.

q is the average value of the degree of substitution of "Ra", and is preferably 2 to 3, more preferably 2. It is easy to synthesize the maleimide compound (A2) having an indane structure in the molecule and such q. It is considered that this is because steric hindrance is diminished and the electron density in the aromatic ring increases particularly when q is 2.

n is the average value of the number of repetitions, and is 0.95 to 10 as described above, preferably 0.98 to 8, more preferably 1 to 7, still more preferably 1.1 to 6. The content of the maleimide compound, having an indane structure in the molecule, which is a maleimide compound represented by Formula (5) and a maleimide compound (A5) represented by Formula (6) and in which n that is the average value of the number of repetitions (degree of polymerization) is 0, is preferably 32% by mass or less with respect to the entire amount of the maleimide compound (A2) having an indane structure in the molecule.

The molecular weight distribution (Mw/Mn) of the maleimide compound (A2) having an indane structure in the molecule acquired by GPC measurement is preferably 1 to 4, more preferably 1.1 to 3.8, still more preferably 1.2 to 3.6, particularly preferably 1.3 to 3.4. The molecular weight distribution is acquired by gel permeation chromatography (GPC) measurement.

It is preferable that the maleimide compound (A2) having an indane structure in the molecule further has an arylene structure bonded in the meta-orientation in the molecule. Examples of the arylene structure bonded in the meta-orientation include an arylene structure (an arylene structure in which a structure containing a maleimide group is substituted at the meta position) in which a structure containing a maleimide group (that is, other than "Rb") is bonded to the meta position. The arylene structure bonded in the meta-orientation is the arylene group bonded in the meta-orientation, such as a group represented by Formula (9). Examples of the arylene structure bonded in the meta-orientation include m-arylene groups such as a m-phenylene group and a m-naphthylene group, and more specific examples thereof include a group represented by Formula (9).

Specific examples of the maleimide compound (A2) having an indane structure in the molecule include maleimide compounds represented by Formulas (10) to (12). These maleimide compounds (A2) further have an arylene group bonded in the meta-orientation, such as a group represented by Formula (9), in the molecule.

[Chem. 6]

(10)

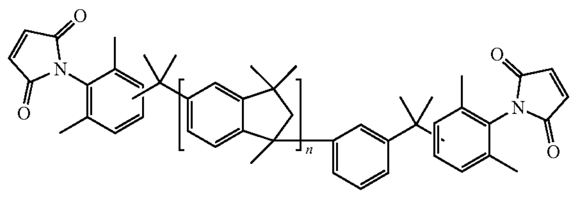

In Formula (10), n represents 0.95 to 10.

[Chem. 7]

(11)

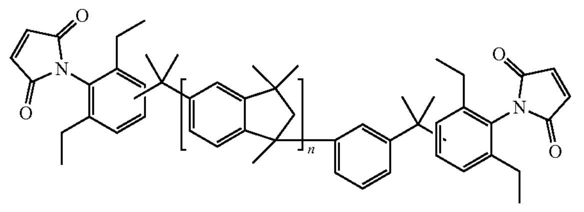

In Formula (11), n represents 0.95 to 10.

[Chem. 8]

(12)

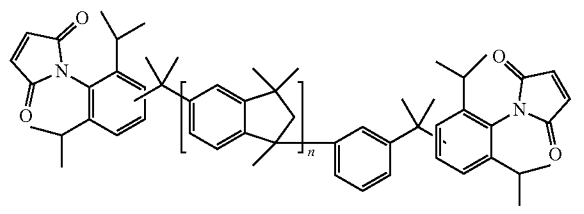

In Formula (12), n represents 0.95 to 10.

The method for producing the maleimide compound (A2) having an indane structure in the molecule is not particularly limited as long as the maleimide compound (A2) having an indane structure in the molecule can be produced. Specifically, the maleimide compound having an indane structure in the molecule is obtained by a so-called maleimidation reaction in which an amine compound represented by the following Formula (13) is reacted with maleic anhydride in an organic solvent such as toluene in the presence of a catalyst such as toluenesulfonic acid. More specifically, after the maleimidation reaction, unreacted maleic anhydride and other impurities are removed by washing with water and the like, and the solvent is removed by reducing the pressure, whereby the maleimide compound (A2) is obtained. A dehydrating agent may be used during this reaction. As the maleimide compound (A2) having an indane structure in the molecule, a commercially available product may be used.

[Chem. 9]

(13)

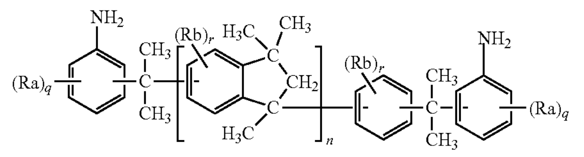

In Formula (13), "Ra"s are independent of each other. In other words, "Ra"s may be the same group as or different groups from each other, and for example, when q is 2 to 4, two to four "Ra"s bonded to the same benzene ring may be the same group as or different groups from each other. "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. "Rb" is the same as "Rb" in Formula (1), and "Rb"s each independently represent an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group. q represents 0 to 4. r represents 0 to 3. n represents 0.95 to 10.

The amine compound represented by Formula (13) is obtained by, for example, reacting 2,6-dimethylaniline with α,α'-dihydroxy-1,3-diisopropylbenzene in an organic solvent such as xylene using activated clay as a catalyst.

(Polymerizable Compound (B))

The polymerizable compound (B) is not particularly limited as long as it is a polymerizable compound having a carbon-carbon unsaturated double bond in the molecule and a proportion of the total mass of heteroatoms to the total mass of all constituent elements of 15% by mass or less.

The polymerizable compound (B) has a carbon-carbon unsaturated double bond in the molecule. Examples of the carbon-carbon unsaturated double bond include double bonds contained in unsaturated hydrocarbon groups such as a vinyl group, an allyl group, and isopropenyl, and the carbon-carbon unsaturated double bond does not include the double bond contained in the maleimide group. In the polymerizable compound (B), the proportion of the total mass of heteroatoms to the total mass of all constituent elements is 15% by mass or less, more preferably 10% by mass or less, still more preferably 5% by mass or less, particularly preferably 0% by mass. The proportion of the total mass of heteroatoms to the total mass of all constituent elements in the polymerizable compound (B) is preferably as low as possible, and the polymerizable compound (B) preferably does not contain a heteroatom. The heteroatom is an atom other than a carbon atom and a hydrogen atom, and examples thereof include a nitrogen atom, an oxygen atom, a sulfur atom, a phosphorus atom, a chlorine atom, an iodine atom, and a bromine atom. In other words, in the polymerizable compound (B), the total mass of carbon atoms and hydrogen atoms with respect to the total mass of all constituent elements is 85% by mass or more, more preferably 90% by mass or more, still more preferably 95% by mass or more, particularly preferably 100% by mass. When the number of heteroatoms is too large, the cured product of the resin composition obtained tends to have poor low dielectric properties, such as a high dielectric loss tangent. Hence, when a polymerizable compound having a carbon-carbon unsaturated double bond in the molecule and a proportion of the total mass of heteroatoms to the total mass of all constituent elements of 15% by mass or less is used, a resin composition that affords a cured product exhibiting excellent low dielectric properties is obtained.

Examples of the polymerizable compound (B) include a polyphenylene ether compound (B1) having a carbon-carbon unsaturated double bond in the molecule and a hydrocarbon-based compound (B2) having a carbon-carbon unsaturated double bond in the molecule. As the polymerizable compound (B), one of these may be used, or these two may be used in combination.

The polyphenylene ether compound (B1) is not particularly limited as long as it is a polyphenylene ether compound having a carbon-carbon unsaturated double bond in the molecule. Examples of the polyphenylene ether compound (B1) include a polyphenylene ether compound having a carbon-carbon unsaturated double bond at the molecular terminal, and more specific examples thereof include a polyphenylene ether compound having a substituent having a carbon-carbon unsaturated double bond at the molecular terminal such as a modified polyphenylene ether compound of which the terminal is modified with a substituent having a carbon-carbon unsaturated double bond.

Examples of the substituent having a carbon-carbon unsaturated double bond include a group represented by the following Formula (14) and a group represented by the following Formula (15). In other words, examples of the polyphenylene ether compound (B1) include a polyphenylene ether compound having at least one selected from a group represented by the following Formula (14) or a group represented by the following Formula (15) at the molecular terminal.

[Chem. 10]

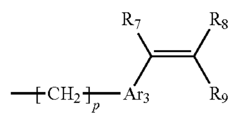

(14)

In Formula (14), $R_7$ to $R_9$ are independent of each other. In other words, $R_7$ to $R_9$ may be the same group as or different groups from each other. $R_7$ to $R_9$ represent a hydrogen atom or an alkyl group. $Ar_3$ represents an arylene group. p represents 0 to 10. In a case where p in Formula (14) is 0, it indicates that $Ar_3$ is directly bonded to the terminal of polyphenylene ether.

The arylene group is not particularly limited. Examples of this arylene group include a monocyclic aromatic group such as a phenylene group and a polycyclic aromatic group that is polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

[Chem. 11]

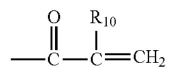

(15)

In Formula (15), $R_{10}$ represents a hydrogen atom or an alkyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

Examples of the group represented by Formula (14) include a vinylbenzyl group (ethenylbenzyl group) represented by the following Formula (16). Examples of the group represented by Formula (15) include an acryloyl group and a methacryloyl group.

[Chem. 12]

(16)

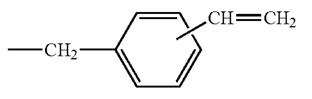

More specific examples of the substituent include vinylbenzyl groups (ethenylbenzyl groups) such as an o-ethenylbenzyl group, a m-ethenylbenzyl group, and a p-ethenylbenzyl group, a vinylphenyl group, an acryloyl group, and a methacryloyl group. The polyphenylene ether compound (B1) may have one substituent or two or more substituents as the substituent. The polyphenylene ether compound (B1) may have, for example, any of an o-ethenylbenzyl group, a m-ethenylbenzyl group, or a p-ethenylbenzyl group, or two or three of these.

The polyphenylene ether compound (B1) has a polyphenylene ether chain in the molecule and preferably has, for example, a repeating unit represented by the following Formula (17) in the molecule.

[Chem. 13]

(17)

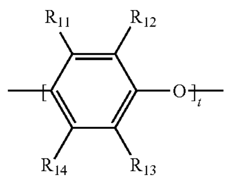

In Formula (17), t represents 1 to 50. $R_{11}$ to $R_{14}$ are independent of each other. In other words, $R_{11}$ to $R_{14}$ may be the same group as or different groups from each other. $R_{11}$ to $R_{14}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_{11}$ to $R_{14}$ include the following.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms and more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms and more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms and more preferably an alkynylcarbonyl group having 3 to 10 carbon atoms. Specific examples thereof include a propioloyl group.

The weight average molecular weight (Mw) of the polyphenylene ether compound (B1) is not particularly limited. Specifically, the weight average molecular weight is preferably 500 to 5000, more preferably 800 to 4000, and still more preferably 1000 to 3000. Here, the weight average molecular weight may be measured by a general molecular weight measurement method, and specific examples thereof include a value measured by gel permeation chromatography (GPC). In a case where the polyphenylene ether compound (B1) has a repeating unit represented by Formula (17) in the molecule, t is preferably a numerical value so that the weight average molecular weight of the polyphenylene ether compound (B1) is in such a range. Specifically, t is preferably 1 to 50.

When the weight average molecular weight of the polyphenylene ether compound (B1) is in such a range, the excellent low dielectric properties of polyphenylene ether are exhibited and a cured product exhibiting not only superior heat resistance but also excellent moldability is afforded. This is considered to be due to the following. When the weight average molecular weight of ordinary polyphenylene ether is in such a range, the heat resistance of the cured product tends to decrease since the molecular weight is relatively low. With regard to this point, since the polyphenylene ether compound (B1) according to the present embodiment has one or more unsaturated double bonds at the terminal, it is considered that a cured product exhibiting sufficiently high heat resistance is obtained. When the weight average molecular weight of the polyphenylene ether compound is within such a range, the polyphenylene ether compound has a relatively low molecular weight and is thus considered to exhibit excellent moldability as well. Hence, it is considered that such a polyphenylene ether compound not only imparts superior heat resistance to the cured product but also exhibits excellent moldability.

In the polyphenylene ether compound (B1), the average number of the substituents (number of terminal functional groups) at the molecular terminal per one molecule of the polyphenylene ether compound is not particularly limited. Specifically, the average number is preferably 1 to 5, more preferably 1 to 3, and still more preferably 1.5 to 3. When the number of terminal functional groups is too small, sufficient heat resistance of the cured product tends to be hardly attained. When the number of terminal functional groups is too large, the reactivity is too high and, for example, troubles such as deterioration in the storage stability of the resin composition or deterioration in the fluidity of the resin composition may occur. In other words, when such a polyphenylene ether compound is used, for example, molding defects such as generation of voids at the time of multilayer molding occur by insufficient fluidity and the like and a problem of moldability that a highly reliable printed wiring board is hardly obtained may occur.

The number of terminal functional groups in the polyphenylene ether compound includes a numerical value expressing the average value of the substituents per one molecule of all the polyphenylene ether compounds present in 1 mole of the polyphenylene ether compound. This number of terminal functional groups can be determined by, for example, measuring the number of hydroxyl groups remaining in the obtained polyphenylene ether compound and calculating the number of hydroxyl groups decreased from the number of hydroxyl groups in the polyphenylene ether before having (before being modified with) the substituent. The number of hydroxyl groups decreased from the number of hydroxyl groups in the polyphenylene ether before being modified is the number of terminal functional groups. Moreover, with regard to the method for measuring the number of hydroxyl groups remaining in the polyphenylene ether compound, the number of hydroxyl groups can be determined by adding a quaternary ammonium salt (tetraethylammonium hydroxide) to be associated with a hydroxyl group to a solution of the polyphenylene ether compound and measuring the UV absorbance of the mixed solution.

The intrinsic viscosity of the polyphenylene ether compound (B1) is not particularly limited. Specifically, the intrinsic viscosity may be 0.03 to 0.12 dl/g, and is preferably 0.04 to 0.11 dl/g and more preferably 0.06 to 0.095 dl/g. When this intrinsic viscosity is too low, the molecular weight tends to be low and low dielectric properties such as a low relative dielectric constant and a low dielectric loss tangent tend to be hardly attained. When the intrinsic viscosity is too high, the viscosity is high, sufficient fluidity is not attained, and the moldability of the cured product tends to decrease. Hence, when the intrinsic viscosity of the polyphenylene ether compound is in the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound (B1) include a polyphenylene ether compound represented by the following Formula (7) and a polyphenylene ether compound represented by the following Formula (8). As the polyphenylene ether compound (B1), these polyphenylene ether compounds may be used singly or these two polyphenylene ether compounds may be used in combination.

[Chem. 14]

(18)

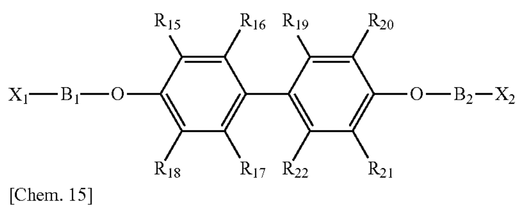

[Chem. 15]

(19)

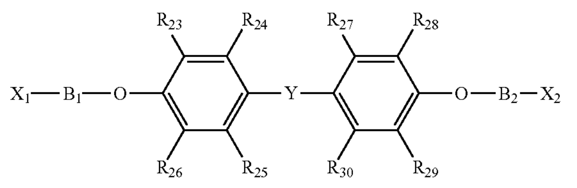

In Formulas (18) and (19), $R_{15}$ to $R_{22}$ and $R_{23}$ to $R_{30}$ are independent of each other. In other words, $R_{15}$ to $R_{22}$ and $R_{23}$ to $R_{30}$ may be the same group as or different groups from each other. $R_{15}$ to $R_{22}$ and $R_{23}$ to $R_{30}$ represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ are independent of each other. In other words, $X_1$ and $X_2$ may be the same group as or different groups from each other. $X_1$ and $X_2$ represent a substituent having a carbon-carbon unsaturated double bond. $B_1$ and $B_2$ represent a repeating unit represented by the following Formula (20) and a repeating unit represented by the following Formula (21), respectively. In Formula (19), Y represents a linear, branched, or cyclic hydrocarbon having 20 or less carbon atoms.

[Chem. 16]

(20)

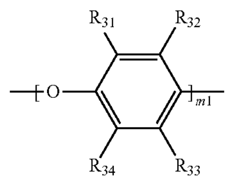

[Chem. 17]

(21)

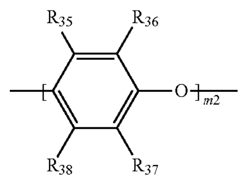

In Formulas (20) and (21), m1 and m2 each represent 0 to 20. $R_{31}$ to $R_{34}$ and $R_{35}$ to $R_{38}$ are independent of each other. In other words, $R_{31}$ to $R_{34}$ and $R_{35}$ to $R_{38}$ may be the same group as or different groups from each other. $R_{31}$ to $R_{34}$ and $R_{35}$ to $R_{38}$ represent a hydrogen atom, an alkyl group, an alkenyl group, an alkynyl group, a formyl group, an alkylcarbonyl group, an alkenylcarbonyl group, or an alkynylcarbonyl group.

The polyphenylene ether compound represented by Formula (18) and the polyphenylene ether compound represented by Formula (19) are not particularly limited as long as they are compounds satisfying the configuration described above. Specifically, in Formulas (18) and (19), $R_{15}$ to $R_{22}$ and $R_{23}$ to $R_{30}$ are independent of each other as described above. In other words, $R_{15}$ to $R_{22}$ and $R_{23}$ to $R_{30}$ may be the same group as or different groups from each other. $R_{15}$ to $R_{22}$ and $R_{23}$ to $R_{30}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (20) and (21), m1 and m2 each preferably represent 0 to 20 as described above. It is preferable that m1 and m2 represent numerical values so that the sum of m1 and m2 is 1 to 30. Hence, it is more preferable that m1 represents 0 to 20, m2 represents 0 to 20, and the sum of m1 and m2 represents 1 to 30. $R_{31}$ to $R_{34}$ and $R_{35}$ to $R_{38}$ are independent of each other. In other words, $R_{31}$ to $R_{34}$ and $R_{35}$ to $R_{38}$ may be the same group as or different groups from each other. $R_{31}$ to $R_{34}$ and $R_{35}$ to $R_{38}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{15}$ to $R_{38}$ are the same as $R_{11}$ to $R_{14}$ in Formula (17).

In Formula (19), Y represents a linear, branched, or cyclic hydrocarbon having 20 or less carbon atoms as described above. Examples of Y include a group represented by the following Formula (22).

[Chem. 18]

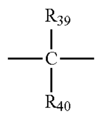

(22)

In Formula (22), $R_{39}$ and $R_{40}$ each independently represent a hydrogen atom or an alkyl group. Examples of the alkyl group include a methyl group. Examples of the group represented by Formula (22) include a methylene group, a methylmethylene group, and a dimethylmethylene group. Among these, a dimethylmethylene group is preferable.

In Formulas (18) and (19), $X_1$ and $X_2$ each independently represent a substituent having a carbon-carbon double bond. In the polyphenylene ether compound represented by Formula (18) and the polyphenylene ether compound represented by Formula (19), $X_1$ and $X_2$ may be the same group as or different groups from each other.

More specific examples of the polyphenylene ether compound represented by Formula (18) include a polyphenylene ether compound represented by the following Formula (23).

[Chem. 19]

(23)

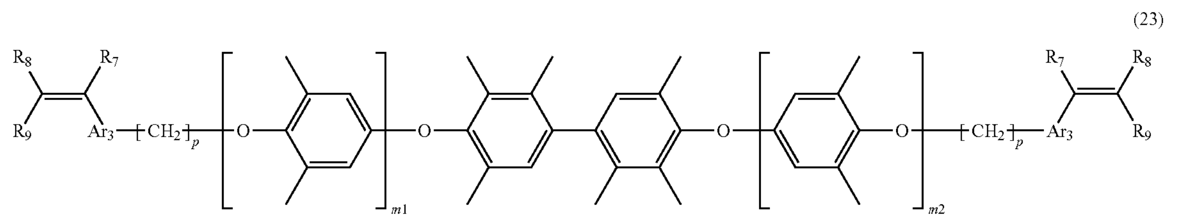

More specific examples of the polyphenylene ether compound represented by Formula (19) include a polyphenylene ether compound represented by the following Formula (24) and a polyphenylene ether compound represented by the following Formula (25).

[Chem. 20]

(24)

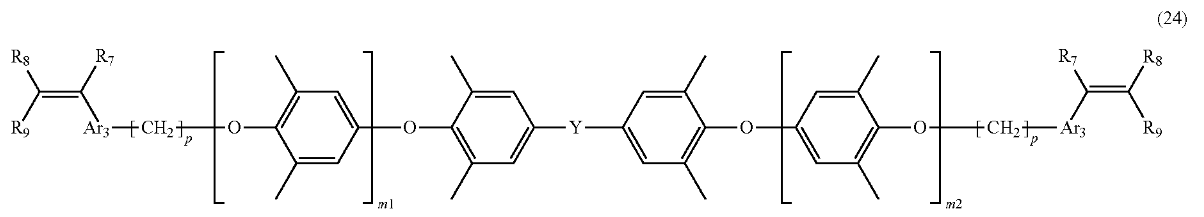

[Chem. 21]

(25)

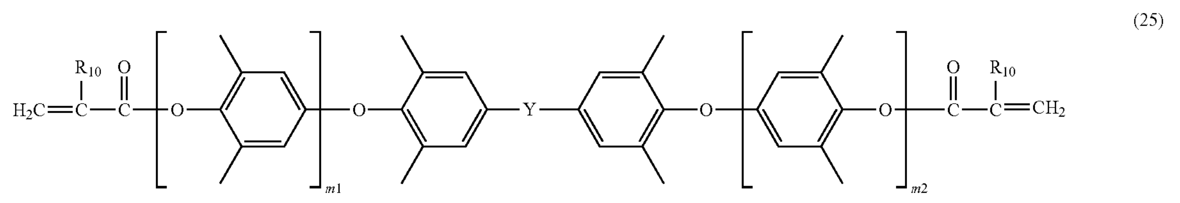

In Formulas (23) to (25), m1 and m2 are the same as m1 and m2 in Formulas (20) and (21). In Formulas (23) and (24), $R_7$ to $R_9$, p, and $Ar_3$ are the same as $R_7$ to $R_9$, p, and $Ar_3$ in Formula (25). In Formulas (24) and (25), Y is the same as Y in Formula (19). In Formula (25), $R_{10}$ is the same as $R_{10}$ in Formula (15).

The method for synthesizing the polyphenylene ether compound (B1) used in the present embodiment is not particularly limited as long as a polyphenylene ether compound having a carbon-carbon unsaturated double bond in the molecule can be synthesized. Specific examples of this method include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents represented by Formulas (14) to (16) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include o-chloromethylstyrene, p-chloromethylstyrene, and m-chloromethylstyrene. The compound in which a substituent having a carbon-carbon unsaturated double bond is bonded to a halogen atom may be used singly or in combination of two or more kinds thereof. For example, o-chloromethylstyrene, p-chloromethylstyrene, and m-chloromethylstyrene may be used singly or in combination of two or three kinds thereof.

Polyphenylene ether that is a raw material is not particularly limited as long as a predetermined polyphenylene ether compound (B1) can be finally synthesized. Specific examples thereof include those containing polyphenylene ether containing 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the polyphenylene ether compound (B1) include the methods described above. Specifically, polyphenylene ether as described above and the compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the polyphenylene ether compound (B1) used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in polyphenylene ether.

The alkali metal hydroxide is not particularly limited as long as it can act as a dehalogenating agent, and examples thereof include sodium hydroxide. In addition, the alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom, and the like, and are not particularly limited as long as they are conditions under which the reaction as described above suitably proceeds. Specifically, the reaction temperature is preferably room temperature to 100° C. and more preferably 30° C. to 100° C. In addition, the reaction time is preferably 0.5 to 20 hours and more preferably 0.5 to 10 hours.

The solvent used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that when the aqueous sodium hydroxide solution is dropped into the solvent subjected to the reaction as well, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition used in the present embodiment preferably contains a polyphenylene ether compound obtained as described above as the polyphenylene ether compound (B1).

The hydrocarbon-based compound (B2) is not particularly limited as long as it is a hydrocarbon-based compound having a carbon-carbon unsaturated double bond in the molecule. The hydrocarbon-based compound (B2) also includes a hydrocarbon-based resin having a carbon-carbon unsaturated double bond in the molecule and a polymer of the hydrocarbon-based compound. Examples of the hydrocarbon-based compound (B2) include a compound represented by the following Formula (1), a compound represented by the following Formula (26), a polyfunctional vinyl aromatic polymer, a cyclic polyolefin resin, and a vinyl aromatic compound-conjugated diene-based compound copolymer.

Examples of the hydrocarbon-based compound (B2) include a compound represented by the following Formula (1) as described above.

[Chem. 22]

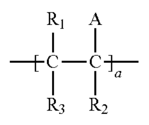

(1)

In Formula (1), $R_1$ to $R_3$ each independently represent a hydrogen atom or an alkyl group. A represents a hydrogen atom, an alkyl group, an alkenyl group, or a group represented by the following Formula (2). a represents 1 to 1000. In a case where a is 2 or more, the hydrocarbon-based compound (B2) preferably contains at least one structural unit represented by Formula (1), and may contain two or more different structural units in combination.

The alkyl group in Formula (1) is not particularly limited, and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group in Formula (1) is not particularly limited but is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

In the compound represented by Formula (1), the number of repeating units a is preferably 1 to 1000, more preferably 2 to 500. This a is the average value of the number of repetitions (degree of polymerization). The hydrocarbon-based compound (B2) may contain a repeating unit of the structural unit represented by Formula (1). In this case, in a case where a is 2 or more, the hydrocarbon-based compound (B2) preferably contains at least one repeating unit of the structural unit represented by Formula (1), and may contain two or more different repeating units in combination.

[Chem. 23]

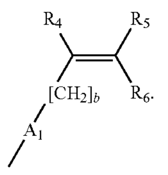

(2)

In Formula (2), $R_4$ to $R_6$ each independently represent a hydrogen atom or an alkyl group. $Ar_1$ represents an arylene group. b represents 0 to 1.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited but is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

More specific examples of the group represented by Formula (2) include the following Formula (7) and the following Formula (8). The compound represented by Formula (1) preferably includes a compound containing one of a group represented by the following Formula (7) and a group represented by the following Formula (8) as the group represented by Formula (2) in the molecule.

[Chem. 24]

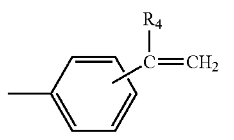

(7)

In Formula (7), $R_4$ represents a hydrogen atom or an alkyl group.

[Chem. 25]

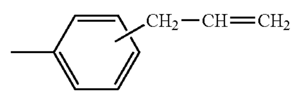

(8)

Examples of the hydrocarbon-based compound (B2) include a compound represented by the following Formula (26) as described above.

[Chem. 26]

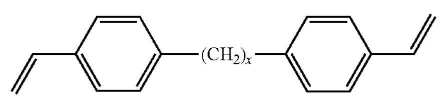

(26)

In Formula (26), x represents 1 to 20. In the compound represented by Formula (26), x is preferably 1 to 12, more preferably 1 to 6. Specific examples of the compound represented by Formula (26) include a compound represented by Formula (26) where x is 1 [bis(4-vinylphenyl) methane (BVPM)], a compound represented by Formula (26) where x is 2 [1,2-bis(vinylphenyl)ethane (BVPE)], and a compound represented by Formula (26) where x is 6 [1,6-bis(4-vinylphenyl)hexane (BVPH)].

As a method for producing the compound represented by Formula (26), the compound can be produced by subjecting 1-(chloromethyl)-4-vinylbenzene to Grignard reaction, for example, in a case where a compound represented by Formula (26) where x is 2 is produced.

Examples of the polyfunctional vinyl aromatic polymer include a polymer obtained by polymerizing at least one of a polyfunctional vinyl aromatic compound and a derivative thereof, namely, a polymer containing at least one of a structure derived from a polyfunctional vinyl aromatic compound and a structure derived from a derivative of the polyfunctional vinyl aromatic compound in the molecule. The polyfunctional vinyl aromatic polymer may be a polymer containing one of a structure derived from a polyfunctional vinyl aromatic compound and a structure derived from a derivative of the polyfunctional vinyl aromatic compound in the molecule or a polymer containing two or more of these structures in the molecule.

The polyfunctional vinyl aromatic compound is a compound containing two or more vinyl groups and an aromatic ring as a single ring or condensed ring in the molecule. Among the polyfunctional vinyl aromatic compounds, the divinyl aromatic compound having two vinyl groups is not particularly limited, but examples thereof include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof.

Suitable specific examples of the divinyl aromatic compound include divinylbenzene (both m- and p-isomers), divinylbiphenyl (including all isomers), and divinylnaphthalene (including all isomers) from the viewpoint of cost and heat resistance of the obtained polymer. More preferred specific examples thereof include divinylbenzene (both m- and p-isomers) and divinylbiphenyl (including all isomers). In particular, divinylbenzene (both m- and p-isomers) is preferably used. Furthermore, in fields required to exhibit high heat resistance, divinylbiphenyl (including all isomers) and divinylnaphthalene (including all isomers) are suitably used.

Examples of a derivative of the polyfunctional vinyl aromatic compound include derivatives of these polyfunctional vinyl aromatic compounds. The polyfunctional vinyl aromatic polymer may be a polymer obtained by further polymerizing a monovinyl aromatic compound or another compound. In other words, the polyfunctional vinyl aromatic polymer may be a polymer having not only a structure derived from a polyfunctional vinyl aromatic compound and a structure derived from a derivative of the polyfunctional vinyl aromatic compound but also a structure derived from a monovinyl aromatic compound and a structure derived from another compound in the molecule.

The monovinyl aromatic compound is a compound containing one vinyl group and an aromatic ring as a single ring or condensed ring in the molecule. Examples of the monovinyl aromatic compound include an ethylvinyl aromatic compound and a monovinyl aromatic compound other than the ethylvinyl aromatic compound.

Examples of the ethylvinyl aromatic compound include, but are not limited to, o-ethylvinylbenzene, m-ethylvinylbenzene, p-ethylvinylbenzene, 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, and 4-vinyl-4'-ethylbiphenyl. These may be used singly or in combination of two or more kinds thereof. Suitable specific examples of the ethylvinyl aromatic compound include ethylvinylbenzene (both m- and p-isomers) and ethylvinylbiphenyl (including all isomers) from the viewpoint of cost, anti-gelling properties, and heat resistance of the obtained polymer.

Examples of the monovinyl aromatic compound other than the ethylvinyl aromatic compound include an aromatic compound having one polymerizable double bond. Here, the carbon atoms constituting the vinyl group in the monovinyl aromatic compound may be substituted with an alkyl group and the like.

Examples of the monovinyl aromatic compound include, but are not limited to, unsubstituted monovinyl aromatic compounds such as styrene and vinylnaphthalene, nuclear alkyl-substituted aromatic vinyl compounds such as nuclear alkyl-substituted styrenes such as p-methylstyrene, α-alkyl-substituted styrenes such as α-methylstyrene, α-alkyl-substituted aromatic vinyl compounds, and aromatic vinyl compounds such as alkoxy-substituted styrenes such as 4-t-butoxystyrene. Examples of the monovinyl aromatic compound include cyclic olefins such as indenes and acenaphthylenes. These may be used singly or in combination of two or more kinds thereof.

As the monovinyl aromatic compound, styrene, α-alkyl-substituted styrene, and α-alkyl-substituted aromatic vinyl compounds among these are preferable from the viewpoint of a large amount of indane structure generated in the skeleton of the copolymer during polymerization. Suitable specific examples of the monovinyl aromatic compound include styrene, α-methylstyrene, and 4-t-butoxystyrene from the viewpoint of cost and heat resistance of the obtained polymer. The monovinyl aromatic compound is effective for the purpose of enhancing the smoothness and flowability of the cured product of the resin composition or the purpose of improving the compatibility with other resins.

The polyfunctional vinyl aromatic copolymer is obtained by polymerizing monomers containing the divinyl aromatic compound and the monovinyl aromatic compound. The amount of the divinyl aromatic compound used is preferably 20 to 99 mol %, more preferably 30 to 95 mol %, still more preferably 50 to 85 mol % with respect to the sum of the amount of the divinyl aromatic compound used and the amount of the monovinyl aromatic compound used. When the content of a structural unit derived from the divinyl aromatic compound is too low, there is a tendency that the curability decreases as well as the heat resistance decreases in a case where the produced polyfunctional vinyl aromatic copolymer is cured.

The amount of the monovinyl aromatic compound used is preferably 1 to 80 mol %, more preferably 5 to 70 mol %, still more preferably 15 to 50 mol % with respect to the sum of the amount of the divinyl aromatic compound used and the amount of the monovinyl aromatic compound used. When the content of a structural unit derived from the monovinyl aromatic compound is too high, the heat resistance tends to decrease in a case where the produced polyfunctional vinyl aromatic copolymer is cured.

The proportion of the ethylvinyl aromatic compound used to the monovinyl aromatic compound other than the ethylvinyl aromatic compound used is not particularly limited, and it is preferable to use these compounds at a ratio so that the compatibility is favorable in the case of blending other resin components with the produced polyfunctional vinyl aromatic copolymer.

In addition to the divinyl aromatic compound and the monovinyl aromatic compound, the monomers forming the polyfunctional vinyl aromatic copolymer may contain small amounts of other monomers such as a trivinyl aromatic compound, another divinyl compound, and a monovinyl compound as long as the effects of the present invention are not impaired. These may be used singly or in combination of two or more kinds thereof. The amount of the other monomers used is preferably less than 30 mol %, more preferably 0 to 15 mol % with respect to the total amount of monomers including the divinyl aromatic compound and the monovinyl aromatic compound.

In the case of containing the other monomers as well, the amount of the divinyl aromatic compound used and the amount of the monovinyl aromatic compound used in the entire amount of the monomers preferably satisfy the above used amounts (mol %), and the same applies to the more preferred range and the still more preferred range as well.

Examples of the cyclic polyolefin resin include a compound having a chain containing an alicyclic compound in the main chain or side chain. Examples of the chain containing an alicyclic compound include chains containing structures represented by the following Structural Formulas (27) to (35).

[Chem. 27]

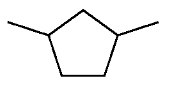

(27)

-continued

[Chem. 28]

(28)

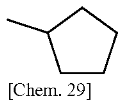

[Chem. 29]

(29)

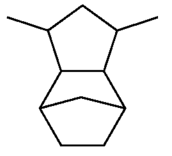

[Chem. 30]

(30)

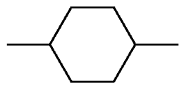

[Chem. 31]

(31)

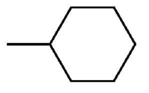

[Chem. 32]

(32)

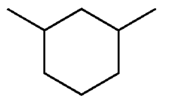

[Chem. 33]

(33)

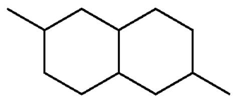

[Chem. 34]

(34)

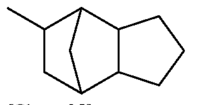

[Chem. 35]

(35)

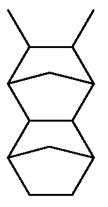

The cyclic polyolefin-based resin includes a cycloolefin copolymer (COC) type in which norbornene and ethylene are copolymerized in the presence of a metallocene catalyst, and a cycloolefin polymer (COP) type of a metathesis ring-opening polymerization type. As the cyclic polyolefin-based resin, these may be used singly or in combination of two or more kinds thereof. Examples of commercially available products of the cyclic polyolefin resin include ZEONEX (registered trademark) and ZEONOR (registered trademark) manufactured by ZEON CORPORATION, ARTON (registered trademark) manufactured by JSR Corporation, APEL (registered trademark) manufactured by Mitsui Chemicals, Inc., and TOPAS (registered trademark) manufactured by Polyplastics Co., Ltd.

The vinyl aromatic compound-conjugated diene-based compound copolymer is not particularly limited as long as it is a copolymer containing a structure derived from a vinyl aromatic compound and a structure derived from a conjugated diene-based compound in the molecule. The vinyl aromatic compound-conjugated diene-based compound copolymer is a copolymer obtained by polymerizing monomers containing the vinyl aromatic compound and the conjugated diene-based compound. Examples of the vinyl aromatic compound-conjugated diene-based compound copolymer include a copolymer obtained by polymerizing monomers containing one or more vinyl aromatic compounds and one or more conjugated diene-based compounds. The vinyl aromatic compound-conjugated diene-based compound copolymer also includes at least partly hydrogenated ones.

The vinyl aromatic compound is a compound having one or more vinyl groups and an aromatic ring in the molecule and a derivative thereof, and examples thereof include styrene, a styrene derivative, one in which some hydrogen atoms in an aromatic ring are substituted with an alkyl group, one in which some hydrogen atoms of the vinyl group in styrene are substituted with an alkyl group, 2-vinylnaphthalene, divinylbenzene, vinyltoluene, α-methylstyrene, butylstyrene, dimethylstyrene, and isopropenyltoluene. Examples of the one in which some hydrogen atoms in an aromatic ring are substituted with an alkyl group include α-methylstyrene and p-methylstyrene. As the vinyl aromatic compound, these may be used singly or in combination of two or more kinds thereof.

The conjugated diene-based compound is a compound having a conjugated diene in the molecule, and examples thereof include 1,3-butadiene, isoprene, 1,3-pentadiene, 1,4-pentadiene, 1,3-heptadiene, cyclopentadiene, 2,3-dimethyl-1,3-butadiene, 1,4-hexadiene, 1,5-hexadiene, 1,3-cyclohexadiene, 1,4-cyclohexadiene, and polymers thereof. As the conjugated diene-based compound, these may be used singly or in combination of two or more kinds thereof.

The vinyl aromatic compound-conjugated diene-based compound copolymer may be a copolymer obtained by polymerizing monomers containing the vinyl aromatic compound and the conjugated diene-based compound and further containing a compound copolymerizable with at least one of the vinyl aromatic compound and the conjugated diene-based compound. Examples of the copolymerizable compound include olefins such as α-pinene, β-pinene, and dipentene, and non-conjugated dienes such as 1,4-hexadiene and 3-methyl-1,4-hexadiene. As the copolymerizable compound, these may be used singly or in combination of two or more kinds thereof.

Examples of the vinyl aromatic compound-conjugated diene-based compound copolymer include a methylstyrene (ethylene/butylene) methylstyrene copolymer, a methylstyrene (ethylene-ethylene/propylene) methylstyrene copolymer, a styrene isoprene copolymer, a styrene isoprene styrene copolymer, a styrene (ethylene/butylene) styrene copolymer, a styrene (ethylene-ethylene/propylene) styrene copolymer, a styrene butadiene styrene copolymer, a styrene (butadiene/butylene) styrene copolymer, a styrene isobutylene styrene copolymer, and hydrogenated products thereof. Examples of the hydrogenated products include a hydrogenated methylstyrene (ethylene/butylene) methylstyrene copolymer, a hydrogenated methylstyrene (ethylene-ethylene/propylene) methylstyrene copolymer, a hydrogenated styrene isoprene copolymer, a hydrogenated styrene isoprene styrene copolymer, a hydrogenated styrene (ethylene/ butylene) styrene copolymer, and a hydrogenated styrene (ethylene-ethylene/propylene) styrene copolymer.

As the vinyl aromatic compound-conjugated diene-based compound copolymer, the above-exemplified vinyl aromatic compound-conjugated diene-based compound copolymer may be singly or in combination of two or more kinds thereof.

In the vinyl aromatic compound-conjugated diene-based compound copolymer, the content of a structural unit derived from the vinyl aromatic compound is preferably 5% to 95% by mass, more preferably 10% to 80% by mass, still more preferably 20% to 50% by mass.

The weight average molecular weight of the vinyl aromatic compound-conjugated diene-based compound copolymer is preferably 1,000 to 300,000, more preferably 1,200 to 200,000. When the molecular weight is too low, the glass transition temperature or heat resistance of the cured product of the resin composition tends to decrease. When the molecular weight is too high, the viscosity of the resin composition when prepared in the form of a varnish and the viscosity of the resin composition during heat molding tend to be too high. The weight average molecular weight is only required to be one measured by a general molecular weight measurement method, and specific examples thereof include a value measured by gel permeation chromatography (GPC).

(Inorganic Filler)

The inorganic filler is not particularly limited as long as it is an inorganic filler that can be used as an inorganic filler contained in a resin composition. Examples of the inorganic filler include metal oxides such as silica, alumina, titanium oxide, magnesium oxide and mica, metal hydroxides such as magnesium hydroxide and aluminum hydroxide, talc, aluminum borate, barium sulfate, aluminum nitride, boron nitride, barium titanate, magnesium carbonate such as anhydrous magnesium carbonate, and calcium carbonate. Among these, silica, metal hydroxides such as magnesium hydroxide and aluminum hydroxide, aluminum oxide, boron nitride, and barium titanate are preferable, and silica is more preferable. The silica is not particularly limited, and examples thereof include crushed silica, spherical silica, and silica particles.

The inorganic filler may be an inorganic filler subjected to a surface treatment or an inorganic filler not subjected to a surface treatment. Examples of the surface treatment include treatment with a silane coupling agent.

Examples of the silane coupling agent include a silane coupling agent having at least one functional group selected from the group consisting of a vinyl group, a styryl group, a methacryloyl group, an acryloyl group, a phenylamino group, an isocyanurate group, a ureido group, a mercapto group, an isocyanate group, an epoxy group, and an acid anhydride group. In other words, examples of this silane coupling agent include compounds having at least one of a vinyl group, a styryl group, a methacryloyl group, an acryloyl group, a phenylamino group, an isocyanurate group, a ureido group, a mercapto group, an isocyanate group, an epoxy group, and an acid anhydride group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-actyloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

The average particle size of the inorganic filler is not particularly limited, and is preferably 0.05 to 10 μm, more preferably 0.1 to 8 μm. Here, the average particle size refers to the volume average particle size. The volume average particle size can be measured by, for example, a laser diffraction method and the like.

(Curing Agent)

The resin composition according to the present embodiment may contain a curing agent that reacts with at least one of the maleimide compound (A) and the polymerizable compound (B), if necessary, as long as the effects of the present invention are not impaired. Here, the curing agent refers to a compound that reacts with at least one of the maleimide compound (A) and the polymerizable compound (B) and contributes to curing of the resin composition. Examples of the curing agent include a maleimide compound (C) different from the maleimide compound (A), an epoxy compound, a methacrylate compound, an acrylate compound, a cyanate ester compound, an active ester compound, a benzoxazine compound, and an allyl compound.

The maleimide compound (C) is a maleimide compound that is not the maleimide compound (A) (a maleimide compound that has a maleimide equivalent of 500 g/eq. or less, is solid at 25° C., and dissolves at one or more concentration in a range of 40% by mass or more and less than 100% by mass as the concentration of the maleimide compound in a mixture of at least one selected from the group consisting of toluene and methyl ethyl ketone and the maleimide compound at 25° C.). Specifically, the maleimide compound (C) is a maleimide compound that has a maleimide equivalent of more than 500 g/eq., a maleimide compound that is liquid at 25° C., and a maleimide compound that does not dissolve at any concentration in a range of 40% by mass or more and less than 100% by mass as the concentration of the maleimide compound in a mixture of at least one selected from the group consisting of toluene and methyl ethyl ketone and the maleimide compound at 25° C. Examples of the maleimide compound (C) include a maleimide compound that has a maleimide group in the molecule but does not have an arylene structure bonded in the meta-orientation or an indane structure in the molecule, and examples thereof include a maleimide compound having one or more maleimide groups in the molecule and a modified maleimide compound. Examples of the maleimide compound (C) include phenylmaleimide compounds such as 4,4'-diphenylmethanebismaleimide, polyphenylmethanemaleimide, m-phenylenebismaleimide, bisphenol A diphenyl ether bismaleimide, 3,3'-dimethyl-5,5'-diethyl-4,4'-diphenylmethanebismaleimide, 4-methyl-1,3-phenylenebismaleimide, and a biphenylaralkyl type polymaleimide compound, and an N-alkyl bismaleimide compound having an aliphatic skeleton. Examples of the modified maleimide compound include a modified maleimide compound in which a part of the molecule is modified with an amine compound and a modified maleimide compound in which a part of the molecule is modified with a silicone compound. As the maleimide compound (C), a commercially available product can also be used, and for example, BMI-4000 and BMI-5100 manufactured by Daiwa Kasei Industry Co., Ltd.

and BMI-689, BMI-1500, and BMI-3000J manufactured by Designer Molecules Inc. may be used.

The epoxy compound is a compound having an epoxy group in the molecule, and specific examples thereof include a bisphenol type epoxy compound such as a bisphenol A type epoxy compound, a phenol novolac type epoxy compound, a cresol novolac type epoxy compound, a dicyclopentadiene type epoxy compound, a bisphenol A novolac type epoxy compound, a biphenylaralkyl type epoxy compound, and a naphthalene ring-containing epoxy compound. The epoxy compound also includes an epoxy resin, which is a polymer of each of the epoxy compounds.

The methacrylate compound is a compound having a methacryloyl group in the molecule, and examples thereof include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate (DCP).

The acrylate compound is a compound having an acryloyl group in the molecule, and examples thereof include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The cyanate ester compound is a compound having a cyanato group in the molecule, and examples thereof include 2,2-bis(4-cyanatophenyl)propane, bis(3,5-dimethyl-4-cyanatophenyl)methane, and 2,2-bis(4-cyanatophenyl)ethane.

The active ester compound is a compound having an ester group exhibiting high reaction activity in the molecule, and examples thereof include a benzenecarboxylic acid active ester, a benzenedicarboxylic acid active ester, a benzenetricarboxylic acid active ester, a benzenetetracarboxylic acid active ester, a naphthalenecarboxylic acid active ester, a naphthalenedicarboxylic acid active ester, a naphthalenetricarboxylic acid active ester, a naphthalenetetracarboxylic acid active ester, a fluorenecarboxylic acid active ester, a fluorenedicarboxylic acid active ester, a fluorenetricarboxylic acid active ester, and a fluorenetetracarboxylic acid active ester.

The benzoxazine compound is a compound having a benzoxazine ring in the molecule, and examples thereof include a benzoxazine resin.

The allyl compound is a compound having an allyl group in the molecule, and examples thereof include a triallyl isocyanurate compound such as triallyl isocyanurate (TAIL), a diallyl bisphenol compound, and diallyl phthalate (DAP).

As the curing agent, the above curing agents may be used singly or in combination of two or more kinds thereof.

The weight average molecular weight of the curing agent is not particularly limited and is, for example, preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is in such a range. It is considered that this is because the resin composition can be suitably cured. Here, the weight average molecular weight may be measured by a general molecular weight measurement method, and specific examples thereof include a value measured by gel permeation chromatography (GPC).

In the curing agent, the average number (number of functional groups) of the functional groups, which contribute to the reaction during curing of the resin composition, per one molecule of the curing agent varies depending on the weight average molecular weight of the curing agent but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Content)

The content of the maleimide compound (A) is preferably 10 to 90 parts by mass, more preferably 15 to 80 parts by mass with respect to 100 parts by mass of the total mass of the maleimide compound (A) and the polymerizable compound (B). In other words, the content of the polymerizable compound (B) is preferably 10 to 90 parts by mass, more preferably 20 to 85 parts by mass with respect to 100 parts by mass of the total mass of the maleimide compound (A) and the polymerizable compound (B). In a case where the resin composition contains the curing agent, the content of the curing agent is preferably 1 to 30 parts by mass, more preferably 3 to 20 parts by mass with respect to 100 parts by mass of the total mass of the maleimide compound (A), the polymerizable compound (B), and the curing agent. When the content of the maleimide compound (A) is too low, there is a tendency that the effect attained by addition of the maleimide compound (A) is unlikely to be exerted, and for example, the coefficient of thermal expansion cannot be sufficiently decreased, or the glass transition temperature decreases and excellent heat resistance is unlikely to be maintained, or the adhesive properties to a metal foil decrease. When the content of the maleimide compound (A) is too high, the cured product tends to exhibit increased water absorbing properties. For these reasons, when the content of each of the maleimide compound (A) and the polymerizable compound (B) is in the above range, a cured product, which exhibits excellent low dielectric properties and heat resistance and has a low coefficient of thermal expansion and a low water absorption, is more suitably obtained.

The resin composition may contain an inorganic filler as described above. In a case where the resin composition contains the inorganic filler, the content of the inorganic filler is preferably 10 to 250 parts by mass, more preferably 40 to 200 parts by mass with respect to 100 parts by mass of the total mass of the maleimide compound (A) and the polymerizable compound (B).

(Other Components)

The resin composition according to the present embodiment may contain components (other components) other than the maleimide compound (A) and the polymerizable compound (B), if necessary, as long as the effects of the present invention are not impaired. As the other components contained in the resin composition according to the present embodiment, for example, additives such as a reaction initiator, a reaction accelerator, a catalyst, a polymerization retarder, a polymerization inhibitor, a dispersant, a leveling agent, a silane coupling agent, an antifoaming agent, an antioxidant, a heat stabilizer, an antistatic agent, an ultraviolet absorber, a dye or a pigment, and a lubricant may be further contained in addition to a curing agent and an inorganic filler as described above.

As described above, the resin composition according to the present embodiment may contain a reaction initiator. The curing reaction can proceed even though the resin composition does not contain a reaction initiator. However, a reaction initiator may be added since there is a case where it is difficult to raise the temperature until curing proceeds depending on the process conditions. The reaction initiator is not particularly limited as long as it can promote the curing reaction of the resin composition, and examples thereof include a peroxide and an organic azo compound. Examples of the peroxide include dicumyl peroxide, α,α-bis(t-butylperoxy-m-isopropyl)benzene, 2,5-dimethyl-2,5-di(t-butylperoxy)-3-hexyne, and benzoyl peroxide. Examples of the organic azo compound include azobisisobutyronitrile. A metal carboxylate can be concurrently used if necessary. By doing so, the curing reaction can be further promoted. Among these, α,α'-bis(t-butylperoxy-m-isopropyl)benzene is preferably used. α,α-Bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in storage stability of the resin composition. α,α'-Bis(t-butylperoxy-m-isopropyl)benzene exhibits low volatility, thus does not volatilize at the time of prepreg drying and storage, and exhibits favorable stability. The reaction initiators may be used singly or in combination of two or more thereof.

As described above, the resin composition according to the present embodiment may contain a silane coupling agent. The silane coupling agent may be contained in the resin composition or may be contained as a silane coupling agent covered on the inorganic filler contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance. Examples of the silane coupling agent include those similar to the silane coupling agents used in the surface treatment of the inorganic filler described above.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene that have a melting point of 300° C. or more, and a bromostyrene-based compound that reacts with the polymerizable compound are preferable. It is considered that the elimination of halogen at a high temperature and the decrease in heat resistance can be suppressed by the use of a halogen-based flame retardant. There is a case where a flame retardant containing phosphorus (phosphorus-based flame retardant) is used in fields required to be halogen-free. The phosphorus-based flame retardant is not particularly limited, and examples thereof include a phosphate ester-based flame retardant, a phosphazene-based flame retardant, a bis(diphenylphosphine oxide)-based flame retardant, and a phosphinate-based flame retardant. Specific examples of the phosphate ester-based flame retardant include a condensed phosphate ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as an aluminum dialkyl phosphinate. As the flame retardant, the respective flame retardants exemplified may be used singly or in combination of two or more kinds thereof (Production Method)

The method for producing the resin composition is not particularly limited, and examples thereof include a method in which the maleimide compound (A) and the polymerizable compound (B) are mixed together so as to have predetermined contents. Examples thereof include the method to be described later in the case of obtaining a varnish-like composition containing an organic solvent.

Moreover, by using the resin composition according to the present embodiment, a prepreg, a metal-clad laminate, a wiring board, a metal foil with resin, and a film with resin can be obtained as described below.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous base material or a prepreg including the resin composition before being cured (the resin composition in A stage) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polyphenylene ether compound (B1), the curing agent and the like, and does not inhibit the curing reaction. Specific examples thereof include toluene and methyl ethyl ketone (MEK).

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less. The glass fiber constituting the glass cloth is not particularly limited, and examples thereof include Q glass, NE glass, E glass, S glass, T glass, L glass, and L2 glass. The surface of the fibrous base material may be subjected to a surface treatment with a silane coupling agent. The silane coupling agent is not particularly limited, but examples thereof include a silane coupling agent having at least one selected from the group consisting of a vinyl group, an acryloyl group, a methacryloyl group, a styryl group, an amino group, and an epoxy group in the molecule.

The method for manufacturing the prepreg is not particularly limited as long as the prepreg can be manufactured. Specifically, when the prepreg is manufactured, the resin composition according to the present embodiment described above is often prepared in a varnish form and used as a resin varnish as described above.

Specific examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 40° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition, which affords a cured product exhibiting excellent low dielectric properties and heat resistance and a low coefficient of thermal expansion. For this reason, the prepreg including this resin composition or a semi-cured product of this resin composition is a prepreg, which affords a cured product exhibiting excellent low dielectric properties and heat resistance and a low coefficient of thermal expansion. Moreover, a wiring board including an insulating layer containing a cured product, which exhibits excellent low dielectric properties and heat resistance and a low coefficient of thermal expansion, can be suitably manufactured using this prepreg.

[Metal-Clad Laminate]

Figure 2:
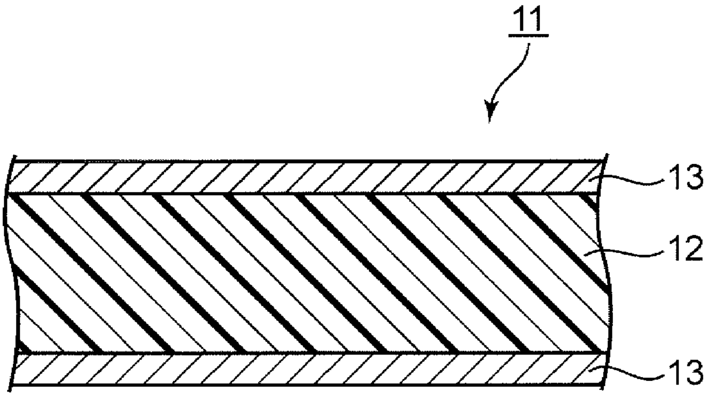
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 according to the present embodiment includes an insulating layer 12 containing a cured product of the resin composition and a metal foil 13 provided on the insulating layer 12. Examples of the metal-clad laminate 11 include a metal-clad laminate including an insulating layer 12 containing a cured product of the prepreg 1 illustrated in FIG. 1 and a metal foil 13 to be laminated together with the insulating layer 12. The insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 μm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11, the kind of the resin composition contained in the prepreg 1, and the like. For example, it is possible to set the temperature to 170° C. to 230° C., the pressure to 2 to 4 MPa, and the time to 60 to 150 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition, which affords a cured product exhibiting excellent low dielectric properties and heat resistance and a low coefficient of thermal expansion. For this reason, the metal-clad laminate including an insulating layer containing a cured product of this resin composition is a metal-clad laminate including an insulating layer containing a cured product, which exhibits excellent low dielectric properties and heat resistance and a low coefficient of thermal expansion. Moreover, a wiring board including an insulating layer containing a cured product, which exhibits excellent low dielectric properties and heat resistance and a low coefficient of thermal expansion, can be suitably manufactured using this metal-clad laminate.

[Wiring Board]

Figure 3:
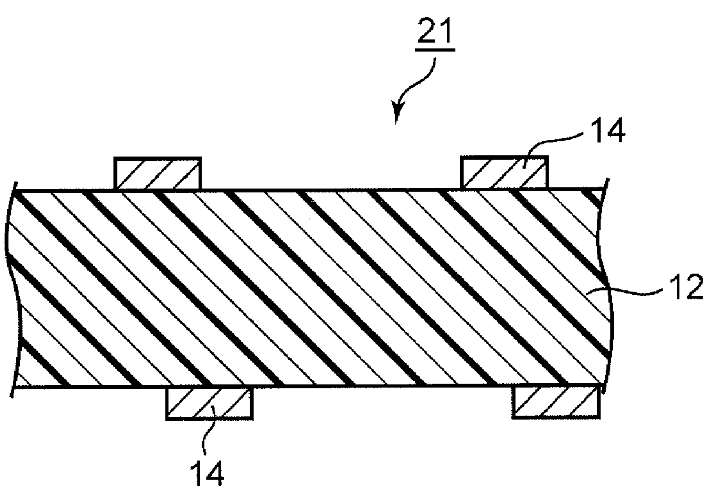
FIG. 3 is a schematic sectional view illustrating an example of a wiring board according to an embodiment of the present invention.

FIG. 3 is a schematic sectional view illustrating an example of a wiring board 21 according to an embodiment of the present invention.

As illustrated in FIG. 3, the wiring board 21 according to the present embodiment includes an insulating layer 12 containing a cured product of the resin composition and wiring 14 provided on the insulating layer 12. Examples of the wiring board 21 include a wiring board formed of an insulating layer 12 obtained by curing the prepreg 1 illustrated in FIG. 1 and wiring 14 which is laminated together with the insulating layer 12 and is formed by partially removing the metal foil 13. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above. The wiring board 21 is a wiring board including the insulating layer 12 containing a cured product, which exhibits excellent low dielectric properties and heat resistance and a low coefficient of thermal expansion.

[Metal Foil with Resin]

Figure 4:
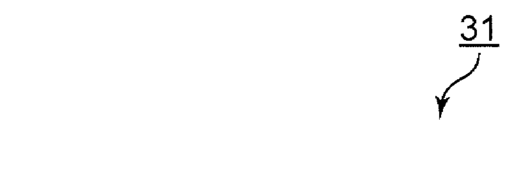
FIG. 4 is a schematic sectional view illustrating an example of a metal foil with resin according to an embodiment of the present invention.
Figure 4:
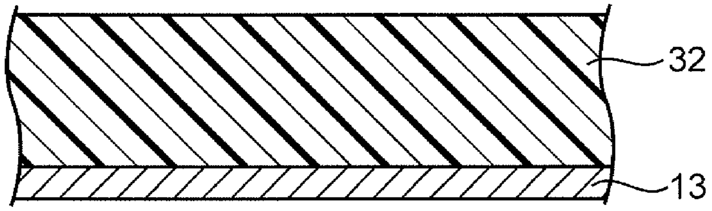

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the resin composition in B stage) and a metal foil or a metal foil with resin including a resin layer containing the resin composition before being cured (the resin composition in A stage) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils used in metal-clad laminates or metal foils with resin can be used without limitation. Examples of the metal foil include a copper foil and an aluminum foil.

The metal foil with resin 31 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 40° C. or more and 180° C. or less and 0.1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition, which affords a cured product exhibiting excellent low dielectric properties and heat resistance and a low coefficient of thermal expansion. For this reason, the metal foil with resin including a resin layer containing this resin composition or a semi-cured product of this resin composition is a metal foil with resin including a resin layer, which affords a cured product exhibiting excellent low dielectric properties and heat resistance and a low coefficient of thermal expansion. Moreover, this metal foil with resin can be used in the manufacture of a wiring board including an insulating layer containing a cured product, which exhibits excellent low dielectric properties and heat resistance and a low coefficient of thermal expansion. For example, by laminating the metal foil with resin on a wiring board, a multilayer wiring board can be manufactured. As a wiring board obtained using such a metal foil with resin, there is obtained a wiring board including an insulating layer containing a cured product, which exhibits excellent low dielectric properties and heat resistance and a low coefficient of thermal expansion.

[Film with Resin]

Figure 5:
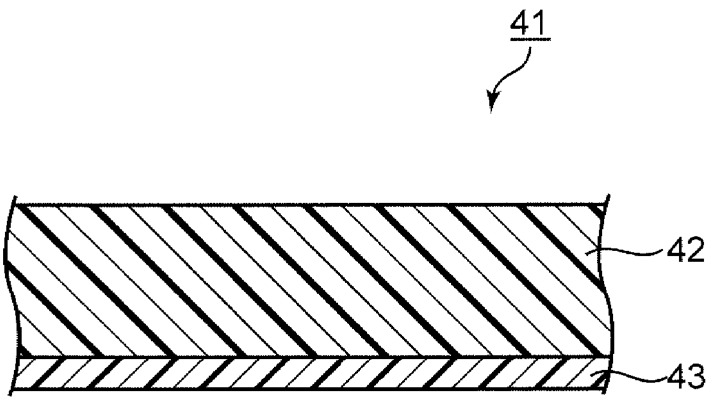
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the resin composition in B stage) and a support film or a film with resin including a resin layer containing the resin composition before being cured (the resin composition in A stage) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films used in films with resin can be used without limitation. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 40° C. or more and 180° C. or less and 0.1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition, which affords a cured product exhibiting excellent low dielectric properties and heat resistance and a low coefficient of thermal expansion. For this reason, the film with resin including a resin layer containing this resin composition or a semi-cured product of this resin composition is a film with resin including a resin layer, which affords a cured product exhibiting excellent low dielectric properties and heat resistance and a low coefficient of thermal expansion. Moreover, this film with resin can be used in suitable manufacture of a wiring board including an insulating layer containing a cured product, which exhibits excellent low dielectric properties and heat resistance and a low coefficient of thermal expansion. A multilayer wiring board can be manufactured, for example, by laminating the film with resin on a wiring board and then peeling off the support film from the film with resin or by peeling off the support film from the film with resin and then laminating the film with resin on a wiring board. As a wiring board obtained using such a film with resin, there is obtained a wiring board including an insulating layer containing a cured product, which exhibits excellent low dielectric properties and heat resistance and a low coefficient of thermal expansion.

According to the present invention, it is possible to provide a resin composition, which affords a cured product exhibiting excellent low dielectric properties and heat resistance and a low coefficient of thermal expansion. In addition, according to the present invention, a prepreg, a film with resin, a metal foil with resin, a metal-clad laminate, and a wiring board which are obtained using the resin composition are provided.

Hereinafter, the present invention will be described more specifically with reference to examples, but the scope of the present invention is not limited thereto.

EXAMPLES

Examples 1 to 17 and Comparative Examples 1 to 5

The respective components to be used when preparing a resin composition in the present examples will be described.

(Maleimide Compound (A))

Maleimide compound (A)-1: Biphenylaralkyl type maleimide compound (MIR-3000 manufactured by Nippon Kayaku Co., Ltd., maleimide equivalent: 275 g/eq., solid at 25° C.)

When the maleimide compound (A)-1 was added to a solvent so that the solute concentration (the ratio of the maleimide compound (A)-1 to the total mass of the solvent and the maleimide compound (A)-1) was 40% by mass when a mixed solvent having a mass ratio of toluene to methyl ethyl ketone (MEK) of 1:3 was used as the solvent, and then stirring was performed at 25° C. for 60 minutes, a mixture in which the maleimide compound (A)-1 was dissolved was obtained. From this fact, the maleimide compound (A)-1 was a maleimide compound that dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C.

In the present Example, it was determined to be dissolution in a case where precipitates and suspended substances were not visually observed in the mixture obtained and the mixture was visually recognized to be transparent. It was determined not to be dissolution (insoluble) in cases (for example, in a case where precipitates were visually observed in the mixture, a case where suspended substances were visually observed in the mixture, and a case where the mixture was not visually recognized to be transparent) other than the case described above.

Maleimide compound (A)-2: Maleimide compound having arylene structure bonded in meta-orientation in the molecule (solid component in MIR-5000-60T (maleimide compound dissolved in toluene) manufactured by Nippon Kayaku Co., Ltd., a maleimide compound represented by Formula (4), maleimide equivalent: 260 g/eq., solid at 25° C.)

As the maleimide compound (A)-2, a mixture was used which had been left at 25° C. for one week or more in a state in which the solute concentration (the ratio of the maleimide compound (A)-2 to the total mass of the solvent and the maleimide compound (A)-2) was 60% by mass when toluene was used as the solvent. It was determined that the maleimide compound (A)-2 was dissolved in toluene since precipitates and suspended substances were not visually observed in this mixture and the mixture was visually recognized to be transparent. From this fact, the maleimide compound (A)-2 was a maleimide compound that dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C.

Maleimide compound (A)-3: Maleimide compound represented by Formula (6) (a maleimide compound having an indane structure in the molecule).

Specifically, this is a maleimide compound synthesized as follows.

First, into a 1-L flask equipped with a thermometer, a condenser, a Dean-Stark tube, and a stirrer, 48.5 g (0.4 mol) of 2,6-dimethylaniline, 272.0 g (1.4 mol) of α,α'-dihydroxy-1,3-diisopropylbenzene, 280 g of xylene, and 70 g of activated clay were introduced and heated to 120° C. while being stirred. Further, the temperature was raised to 210° C. while removing the distilled water through the Dean-Stark tube. By doing so, the reaction was conducted for 3 hours. After that, the reaction mixture was cooled to 140° C., 145.4 g (1.2 mol) of 2,6-dimethylaniline was introduced, and then the temperature was raised to 220° C. By doing so, the reaction was conducted for 3 hours. After the reaction, the reaction mixture was air-cooled to 100° C., and diluted with 300 g of toluene, and activated clay was removed by filtration, and low molecular weight substances such as the solvent and unreacted substances were distilled off under reduced pressure, thereby obtaining 364.1 g of a solid. The obtained solid was an amine compound (amine equivalent: 298, softening point: 70° C.) represented by the following Formula (36).

[Chem. 36]

(36)

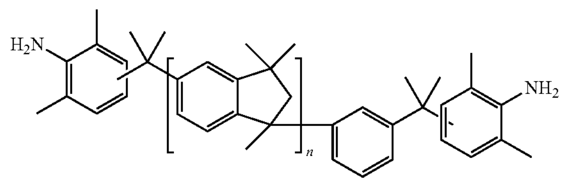

Next, 131.8 g (1.3 mol) of maleic anhydride and 700 g of toluene were introduced into a 2-L flask equipped with a thermometer, a condenser, a Dean-Stark tube, and a stirrer, and stirred at room temperature. After that, a mixed solution of 364.1 g of the amine compound represented by Formula (36) and 175 g of DMF was added dropwise over 1 hour. After completion of the dropwise addition, the mixture was further stirred at room temperature for 2 hours to conduct the reaction. After that, 37.1 g of p-toluenesulfonic acid monohydrate was added, the reaction solution was heated, and the azeotropic water and toluene were cooled and separated under reflux, and then only toluene was returned to the system, thereby conducting the dehydration reaction for 8 hours. After air-cooling to room temperature, concentration under reduced pressure was performed, the brown solution was dissolved in 600 g of ethyl acetate and washed with 150 g of deionized water three times and 150 g of 2% aqueous sodium bicarbonate solution three times, sodium sulfate was added for drying, then concentration was performed under reduced pressure, and the obtained reaction product was vacuum-dried at 80° C. for 4 hours, thereby obtaining 413.0 g of a solid. The obtained solid was analyzed by FD-MS spectrum, GPC and the like, and was found to be a maleimide compound represented by Formula (6) (n=1.47, molecular weight distribution (Mw/Mn)=1.81). The obtained maleimide compound represented by Formula (6) had a maleimide equivalent of 378 g/eq., and was solid at 25° C.

When the maleimide compound (A)-3 was added to a solvent so that the solute concentration (the ratio of the maleimide compound (A)-3 to the total mass of the solvent and the maleimide compound (A)-3) was 40% by mass when methyl ethyl ketone (MEK) was used as the solvent, and then stirring was performed at 25° C. for 60 minutes, a mixture in which the maleimide compound (A)-3 was dissolved was obtained. From this fact, the maleimide compound (A)-3 was a maleimide compound that dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C.

Maleimide compound (A)-4: Maleimide compound represented by Formula (6) (a maleimide compound having an indane structure in the molecule).

Specifically, this is a maleimide compound synthesized as follows.

First, into a 1-L flask equipped with a thermometer, a condenser, a Dean-Stark tube, and a stirrer, 48.5 g (0.4 mol) of 2,6-dimethylaniline, 272.0 g (1.4 mol) of α,α-dihydroxy-1,3-diisopropylbenzene, 280 g of xylene, and 70 g of activated clay were introduced and heated to 120° C. while being stirred. Further, the temperature was raised to 210° C. while removing the distilled water through the Dean-Stark tube. By doing so, the reaction was conducted for 6 hours. After that, the reaction mixture was cooled to 140° C., 145.4 g (1.2 mol) of 2,6-dimethylaniline was introduced, and then the temperature was raised to 220° C. By doing so, the reaction was conducted for 3 hours. After the reaction, the reaction mixture was air-cooled to 100° C., and diluted with 300 g of toluene, and activated clay was removed by filtration, and low molecular weight substances such as the solvent and unreacted substances were distilled off under reduced pressure, thereby obtaining 345.2 g of a solid. The obtained solid was an amine compound (amine equivalent: 348, softening point: 71° C.) represented by Formula (36).

Next, 131.8 g (1.3 mol) of maleic anhydride and 700 g of toluene were introduced into a 2-L flask equipped with a thermometer, a condenser, a Dean-Stark tube, and a stirrer, and stirred at room temperature. After that, a mixed solution of 345.2 g of the amine compound represented by Formula (36) and 175 g of DMF was added dropwise over 1 hour. After completion of the dropwise addition, the mixture was further stirred at room temperature for 2 hours to conduct the reaction. After that, 37.1 g of p-toluenesulfonic acid monohydrate was added, the reaction solution was heated, and the azeotropic water and toluene were cooled and separated under reflux, and then only toluene was returned to the system, thereby conducting the dehydration reaction for 8 hours. After air-cooling to room temperature, the reaction mixture was concentrated under reduced pressure, the brown solution was dissolved in 600 g of ethyl acetate and washed with 150 g of deionized water three times and 150 g of 2% aqueous sodium bicarbonate solution three times, sodium sulfate was added for drying, then concentration was performed under reduced pressure, and the obtained reaction product was vacuum-dried at 80° C. for 4 hours, thereby obtaining 407.6 g of a solid. The obtained solid was analyzed by FD-MS spectrum, GPC and the like, and was found to be a maleimide compound represented by Formula (6) (n=2.59, molecular weight distribution (Mw/Mn)=1.49). The obtained maleimide compound represented by Formula (6) had a maleimide equivalent of 428 g/eq., and was solid at 25° C.

When the maleimide compound (A)-4 was added to a solvent so that the solute concentration (the ratio of the maleimide compound (A)-4 to the total mass of the solvent and the maleimide compound (A)-4) was 60% by mass when toluene was used as the solvent, and then stirring was performed at 25° C. for 60 minutes, a mixture in which the maleimide compound (A)-4 was dissolved was obtained. From this fact, the maleimide compound (A)-4 was a maleimide compound that dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C.

(Polymerizable Compound (B))

Polymerizable compound (B)-1: A polymerizable compound having a carbon-carbon unsaturated double bond in the molecule and a proportion of the total mass of heteroatoms to the total mass of all constituent elements of 0% by mass.

Specifically, the polymerizable compound (B)-1 is a polymerizable compound obtained by conducting a reaction as follows.

Into a 3000 ml flask, 1.90 mol (271 ml) of divinylbenzene, 0.10 mol (14.0 ml) of ethylvinylbenzene, 2.00 mol (229 ml) of styrene, 2.70 mol (311 ml) of benzyl chloride, 0.135 mol (32.8 ml) of tetrahydrofuran, and 925 ml of toluene were introduced, and the liquid temperature was raised to 30° C., then 42.1 ml of a toluene solution of 90 mmol $SnCl_4$ (2.14 mmol/ml) was added, and stirring was performed for 3 hours. By doing so, the polymerization reaction was conducted in the flask. After that, the polymerization reaction was stopped by adding a small amount of methanol into the flask. Thereafter, the obtained reaction mixture was cooled to room temperature, and then a large amount of methanol was added to the reaction mixture to precipitate a polymer. The obtained polymer was washed with methanol, separated by filtration, and dried. The finally obtained polymer (copolymer) was 262.2 g, and the yield was 56.5% by mass.

The obtained copolymer had a weight average molecular weight Mw of 7280, a number average molecular weight Mn of 2970, and an Mw/Mn ratio of 2.5. By performing 1H-NMR analysis and $^{13}C$-NMR analysis on the obtained copolymer, it was found that the copolymer contained structural units derived from divinylbenzene and ethylvinylbenzene at 47 mol % and a structural unit derived from styrene at 53 mol %. The copolymer did not contain a heteroatom.

Polymerizable compound (B)-2: 1,2-Bis(vinylphenyl)ethane (BVPE) (a compound represented by Formula (26), where x is 2, and a polymerizable compound having a carbon-carbon unsaturated double bond in the molecule and a proportion of the total mass of heteroatoms to the total mass of all constituent elements of 0% by mass). Specifically, the polymerizable compound (B)-2 is BVPE produced by subjecting vinylbenzyl chloride such as 1-(chloromethyl)-4-vinylbenzene to Grignard reaction.

Specifically, the polymerizable compound (B)-2 was produced as follows.

First, 5.36 g (220 mmol) of granular magnesium for Grignard reaction (manufactured by KANTO CHEMICAL CO., INC.) was placed in a 500 ml three-necked flask, and a dropping funnel, a nitrogen inlet tube, and a septum cap were attached to the flask.

In the three-necked flask, the entire system was desiccated by heating using a dryer while stirring the granular magnesium using a stirrer under a nitrogen stream. After that, 300 ml of dry tetrahydrofuran was taken using a syringe and injected into the three-necked flask through the septum cap.

After the solution in the three-necked flask was cooled to −5° C., 30.5 g (200 mmol) of vinylbenzyl chloride (manufactured by TOKYO CHEMICAL INDUSTRY CO., LTD.) was added dropwise to the solution over about 4 hours using a dropping funnel. After termination of the dropwise addition, stirring was continuously performed at 0° C. for 20 hours to conduct the reaction of vinylbenzyl chloride. After termination of the reaction, the solution obtained by the reaction was filtered to remove residual magnesium and concentrated using an evaporator. This concentrated solution was diluted with hexane, washed one time with a 3.6% hydrochloric acid aqueous solution and three times with pure water, and then desiccated over magnesium sulfate. This desiccated solution was allowed to pass through a short column of silica gel (Wako Gel C300 manufactured by FUJIFILM Wako Pure Chemical Corporation)/hexane for purification, and vacuum dried to obtain BVPE.

Polymerizable compound (B)-3: Divinylbenzene (manufactured by TOKYO CHEMICAL INDUSTRY CO., LTD., a polymerizable compound having a carbon-carbon unsaturated double bond in the molecule and a proportion of the total mass of heteroatoms to the total mass of all constituent elements of 0% by mass)

Polymerizable compound (B)-4: Polyphenylene ether compound having vinylbenzyl group (ethenylbenzyl group) at terminal (a modified polyphenylene ether compound obtained by reacting polyphenylene ether with chloromethylstyrene)

Specifically, this is a modified polyphenylene ether compound obtained by conducting a reaction as follows.

First, 200 g of polyphenylene ether (SA90 manufactured by SABIC Innovative Plastics Co., Ltd., number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene:CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Then, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1H$-NMR (400 MHz, $CDCl_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal in the molecule. Specifically, it was confirmed that the obtained solid was ethenylbenzylated polyphenylene ether. The modified polyphenylene ether compound thus obtained had a carbon-carbon unsaturated double bond in the molecule and had a proportion of the total mass of heteroatoms to the total mass of all constituent elements of 12% by mass.

The number of terminal functional groups in the modified polyphenylene ether was measured as follows.

First, the modified polyphenylene ether was accurately weighed. The weight at that time is defined as X (mg). Thereafter, this modified polyphenylene ether weighed was dissolved in 25 mL of methylene chloride, 100 μL of an ethanol solution of tetraethylammonium hydroxide (TEAH) at 10% by mass (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Then, the number of terminal hydroxyl groups in the modified polyphenylene ether was calculated from the measurement results using the following equation.

$$\text{Residual OH amount } (\mu mol/g)=[(25\times Abs)/(\varepsilon\times OPL\times X)]\times 10^6$$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether is almost zero, it was found that the hydroxyl groups in the polyphenylene ether before being modified are almost modified. From this fact, it was found that the number of terminal hydroxyl groups decreased from the number of terminal hydroxyl groups in polyphenylene ether before being modified is the number of terminal hydroxyl groups in polyphenylene ether before being modified. In other words, it was found that the number of terminal hydroxyl groups in polyphenylene ether before being modified is the number of terminal functional groups in the modified polyphenylene ether. In other words, the number of terminal functional groups was two.

In addition, the intrinsic viscosity (IV) of the modified polyphenylene ether was measured in methylene chloride at 25° C. Specifically, the intrinsic viscosity (IV) of the modified polyphenylene ether was measured in a methylene chloride solution (liquid temperature: 25° C.) of the modified polyphenylene ether at 0.18 g/45 ml using a viscometer (AVS500 Visco System manufactured by SCHOTT Instruments GmbH). As a result, the intrinsic viscosity (IV) of the modified polyphenylene ether was 0.086 dl/g.

The molecular weight distribution of the modified polyphenylene ether was measured by GPC. Moreover, the weight average molecular weight (Mw) was calculated from the obtained molecular weight distribution. As a result, Mw was 1900.

(Curing Agent)

Maleimide compound (C)-1: Maleimide compound insoluble in any solvent of toluene, methyl ethyl ketone, or mixed solvent of toluene and methyl ethyl ketone (BMI manufactured by K.I. Chemical Industry Co., Ltd., maleimide equivalent: 179 g/eq., solid at 25° C., a maleimide compound not having an arylene structure bonded in the meta-orientation and an indane structure in the molecule)

Even when the maleimide compound (C)-1 was added to a solvent so that the solute concentration (the ratio of the maleimide compound (C)-1 to the total mass of the solvent and the maleimide compound (C)-1) was less than 5% by mass, and then stirring was performed at 25° C. for 120 minutes, the maleimide compound (C)-1 did not dissolve. Even when toluene, methyl ethyl ketone, or a mixed solvent of toluene and methyl ethyl ketone was used as the solvent, the maleimide compound (C)-1 did not dissolve. From this fact, the maleimide compound (C)-1 is not the maleimide compound (A) (a maleimide compound that has a maleimide equivalent of 500 g/eq. or less, is solid at 25° C., and dissolves at one or more concentration in a range of 40% by mass or more and less than 100% by mass as the concentration of the maleimide compound in a mixture of at least one selected from the group consisting of toluene and methyl ethyl ketone and the maleimide compound at 25° C.).

Maleimide compound (C)-2: Maleimide compound being liquid at 25° C. (BMI-689 manufactured by Designer Molecules Inc., maleimide equivalent: 344 g/eq., a maleimide compound not having an arylene structure bonded in the meta-orientation and an indane structure in the molecule)

The maleimide compound (C)-2 is, as described above, a maleimide compound being liquid at 25° C. but is not a maleimide compound being solid at 25° C. In other words, the maleimide compound (C)-2 is not the maleimide compound (A) (a maleimide compound that has a maleimide equivalent of 500 g/eq. or less, is solid at 25° C., and dissolves at one or more concentration in a range of 40% by mass or more and less than 100% by mass as the concentration of the maleimide compound in a mixture of at least one selected from the group consisting of toluene and methyl ethyl ketone and the maleimide compound at 25° C.). With regard to the solubility of the maleimide compound (C)-2 in a solvent, the maleimide compound (C)-2 dissolved at a concentration of 50% by mass when toluene was used.

Maleimide compound (C)-3: Maleimide compound having maleimide equivalent of 1500 g/eq (BMI-3000 manufactured by Designer Molecules Inc., solid at 25° C., a maleimide compound not having an arylene structure bonded in the meta-orientation and an indane structure in the molecule)

The maleimide compound (C)-3 is, as described above, a maleimide compound having a maleimide equivalent of more than 500 g/eq., but is not a maleimide compound having a maleimide equivalent of 500 g/eq. or less. In other words, the maleimide compound (C)-3 is not the maleimide compound (A) (a maleimide compound that has a maleimide equivalent of 500 g/eq. or less, is solid at 25° C., and dissolves at one or more concentration in a range of 40% by mass or more and less than 100% by mass as the concentration of the maleimide compound in a mixture of at least one selected from the group consisting of toluene and methyl ethyl ketone and the maleimide compound at 25° C.). With regard to the solubility of the maleimide compound (C)-3 in a solvent, the maleimide compound (C)-3 dissolved at a concentration of 50% by mass when toluene was used.

Allyl compound: Triallyl isocyanurate (TAIC) (TAIC manufactured by Nihon Kasei Co., Ltd., proportion of total mass of heteroatoms to total mass of all constituent elements: 36% by mass)

TAIC is a compound that has a carbon-carbon unsaturated double bond in the molecule but has a proportion of the total mass of heteroatoms to the total mass of all constituent elements of more than 15% by mass.

Methacrylate compound: Tricyclodecane dimethanol dimethacrylate (DCP) (NK Ester DCP manufactured by Shin Nakamura Chemical Co., Ltd., proportion of total mass of heteroatoms to total mass of all constituent elements: 19% by mass)

DCP is a compound that has a carbon-carbon unsaturated double bond in the molecule but has a proportion of the total mass of heteroatoms to the total mass of all constituent elements of more than 15% by mass.

Epoxy compound: Dicyclopentadiene type epoxy resin (HP-7200HHH manufactured by DIC Corporation)

Benzoxazine compound: Pd type benzoxazine compound (manufactured by SHIKOKU CHEMICALS CORPORATION)

Cyanate ester compound: Naphthol aralkyl type cyanate ester compound

Specifically, naphthol aralkyl type cyanate ester compound is a cyanate ester compound obtained by conducting a reaction as follows.

In 1800 g of dichloromethane, 300 g (in terms of OH group: 1.28 mol) of 1-naphthol aralkyl resin (manufactured by NIPPON STEEL Chemical & Material Co., Ltd.) and 194.6 g (1.92 mol) of triethylamine (1.5 mol with respect to 1 mol of hydroxy group) were dissolved, and this was used as a solution 1.

Mixed were 125.9 g (2.05 mol) (1.6 mol with respect to 1 mol of hydroxy group) of cyanogen chloride, 293.8 g of dichloromethane, 194.5 g (1.92 mol) (1.5 mol with respect to 1 mol of hydroxy group) of 36% hydrochloric acid, and 1205.9 g of water. The solution 1 was poured into the obtained mixture over 30 minutes while the mixture was stirred and the liquid temperature was maintained at −2° C. to −0.5° C. After pouring of the solution 1 was terminated, the mixture was stirred at the same temperature for 30 minutes, and then a solution (solution 2) prepared by dissolving 65 g (0.64 mol) (0.5 mol with respect to 1 mol of hydroxy group) of triethylamine in 65 g of dichloromethane was poured over 10 minutes. After pouring of the solution 2 was terminated, the mixture was stirred at the same temperature for 30 minutes to complete the reaction.

After that, the reaction mixture was left to stand still to separate the organic phase and the aqueous phase from each other. The obtained organic phase was washed with 1300 g of water five times. The electrical conductivity of the wastewater after the fifth washing was 5 μS/cm, and it was confirmed that the ionic compounds that could be removed were sufficiently removed by washing with water.

The washed organic phase was concentrated under reduced pressure and finally concentrated to dryness at 90° C. for 1 hour to obtain 331 g of the desired naphthol aralkyl type cyanate ester compound (SNCN) (orange viscous substance). The obtained SNCN had a weight average molecular weight Mw of 600.

(Reaction Initiator)

Organic peroxide: Dicumyl peroxide (manufactured by NOF Corporation)

(Reaction Accelerator)

2E4MZ: 2-Ethyl-4-methylimidazole (2E4MZ manufactured by SHIKOKU CHEMICALS CORPORATION)

Zinc octanoate: Zinc octanoate (Zn-Octoate 20% T manufactured by DIC Corporation)

(Inorganic Filler)

Silica: Spherical silica (SO-C2 manufactured by ADMATECHS COMPANY LIMITED)

[Preparation Method]

First, the respective components other than the inorganic filler were added to and mixed in toluene at the compositions (parts by mass) presented in Tables 1 and 2 so that the solid concentration was 50% by mass. The mixture was stirred for 60 minutes. Thereafter, the filler was added to the obtained liquid, and the inorganic filler was dispersed in the liquid using a bead mill. By doing so, a varnish-like resin composition (varnish) was obtained.

Next, a prepreg and an evaluation substrate (metal-clad laminate) were obtained as follows.

The obtained varnish was impregnated into a fibrous base material (glass cloth: GC2116L, #2116 type, L Glass manufactured by Asahi Kasei Corporation) and then heated and dried at 110° C. for 3 minutes, thereby fabricating a prepreg. At that time, the content (resin content) of the components constituting the resin composition with respect to the prepreg was adjusted to be about 57% by mass by the curing reaction so that one prepreg sheet had a thickness of 125 μm.

Next, an evaluation substrate (metal-clad laminate) was obtained as follows.

Two or six sheets of each of the obtained prepregs were stacked, and copper foil (FV-WS manufactured by Furukawa Electric Co., Ltd., thickness: 18 μm) was disposed on both sides of the stacked body. This as a body to be pressed was heated and pressed at a temperature of 220° C. and a pressure of 3 MPa for 120 minutes, thereby obtaining an evaluation substrate (metal-clad laminate) having a copper foil bonded to both surfaces and a plate thickness of 250 μM (when two prepreg sheets were stacked) or a plate thickness of 750 μm (when six prepreg sheets were stacked).

The prepregs and evaluation substrates (metal-clad laminates) fabricated as described above were evaluated by the following methods.

[Glass Transition Temperature (Tg)]

Using an unclad substrate obtained by removing the copper foil from the evaluation substrate (metal-clad laminate having a plate thickness of 250 μm) by etching as a test piece, the Tg of the cured product was measured by a viscoelastic spectrometer "DMS6100" manufactured by Seiko Instruments Inc. At this time, dynamic viscoelasticity measurement (DMA) was performed with a tensile module at a frequency of 10 Hz, and the temperature at which tan δ was maximized when the temperature was raised from room temperature to 320° C. at a rate of temperature rise of 5° C./min was taken as Tg (° C.).

When the measured Tg is more than 300° C., it is denoted as ">300" in Tables 1 and 2.

[Dielectric Properties (Dielectric Loss Tangent)]

The dielectric loss tangent at 10 GHz was measured by the cavity perturbation method using an unclad substrate obtained by removing the copper foil from the evaluation substrate (metal-clad laminate having a plate thickness of 250 μm) by etching as a test piece. Specifically, the dielectric loss tangent of the evaluation substrate at 10 GHz was measured using a network analyzer (N5230A manufactured by Keysight Technologies).

[Coefficient of Thermal Expansion]

Using an unclad substrate obtained by removing the copper foil from the evaluation substrate (metal-clad laminate having a plate thickness of 750 μm) by etching as a test piece, the coefficient of thermal expansion (CTEz: ppm/° C.) in the Z-axis direction of the base material was measured in a temperature region of less than the glass transition temperature of the cured product of the resin composition by TMA (thermo-mechanical analysis) in conformity with IPC-TM-650 2.4.24. For the measurement, a TMA instrument (TMA6000 manufactured by SII NanoTechnology Inc.) was used, and the measurement was performed in a range of 30° C. to 320° C.

The results of each of the evaluations are presented in Tables 1 and 2. In a case where the varnish cannot be prepared, it is denoted as "-" in the evaluation.

TABLE 1

| | | | Example | | | | | |
|---|---|---|---|---|---|---|---|---|
| | | | 1 | 2 | 3 | 4 | 5 | 6 |
| Composition (parts by mass) | Maleimide compound | Maleimide compound (A)-1 | 50 | — | — | — | — | — |
| | | Maleimide compound (A)-2 | — | 50 | — | — | 50 | — |
| | | Maleimide compound (A)-3 | — | — | 50 | — | — | — |
| | | Maleimide compound (A)-4 | — | — | — | 50 | — | 50 |
| | Polymerizable compound | Polymerizable compound (B)-1 | 50 | 50 | 50 | 50 | — | — |
| | | Polymerizable compound (B)-2 | — | — | — | — | 50 | 50 |
| | | Polymerizable compound (B)-3 | — | — | — | — | — | — |
| | | Polymerizable compound (B)-4 | — | — | — | — | — | — |
| | Curing agent | Maleimide compound (C)-1 | — | — | — | — | — | — |
| | | Maleimide compound (C)-2 | — | — | — | — | — | — |
| | | Maleimide compound (C)-3 | — | — | — | — | — | — |
| | Inorganic filler | Silica | 150 | 150 | 150 | 150 | 150 | 150 |
| Evaluation | Glass transition temperature Tg (° C.) | | 270 | 270 | 250 | 240 | >300 | >300 |
| | Dielectric loss tangent | | 0.0021 | 0.0022 | 0.0020 | 0.0020 | 0.0020 | 0.0020 |
| | Coefficient of thermal expansion (ppm/° C.) | | 40 | 35 | 35 | 35 | 30 | 35 |

| | | | Example | | Comparative Example | | |
|---|---|---|---|---|---|---|---|
| | | | 7 | 8 | 1 | 2 | 3 |
| Composition (parts by mass) | Maleimide compound | Maleimide compound (A)-1 | 50 | 50 | — | — | — |
| | | Maleimide compound (A)-2 | — | — | — | — | — |
| | | Maleimide compound (A)-3 | — | — | — | — | — |
| | | Maleimide compound (A)-4 | — | — | — | — | — |
| | Polymerizable compound | Polymerizable compound (B)-1 | — | — | 50 | 50 | 50 |
| | | Polymerizable compound (B)-2 | — | — | — | — | — |
| | | Polymerizable compound (B)-3 | 50 | — | — | — | — |
| | | Polymerizable compound (B)-4 | — | 50 | — | — | — |
| | Curing agent | Maleimide compound (C)-1 | — | — | 50 | — | — |
| | | Maleimide compound (C)-2 | — | — | — | 50 | — |

TABLE 1-continued

| | | | | | | | |
|---|---|---|---|---|---|---|---|
| | | Maleimide compound (C)-3 | — | — | — | — | 50 |
| | Inorganic filler | Silica | 150 | 150 | 150 | 150 | 150 |
| Evaluation | Glass transition temperature Tg (° C.) | | >300 | 270 | — | 190 | 180 |
| | Dielectric loss tangent | | 0.0024 | 0.0025 | | 0.0020 | 0.0020 |
| | Coefficient of thermal expansion (ppm/° C.) | | 30 | 40 | | 55 | 60 |

TABLE 2

| | | | Example | | | | | |
|---|---|---|---|---|---|---|---|---|
| | | | 9 | 10 | 11 | 12 | 13 | 14 |
| Composition (parts by mass) | Maleimide compound | Maleimide compound (A)-1 | — | — | — | — | — | — |
| | | Maleimide compound (A)-2 | 5 | 15 | 85 | 95 | 45 | 45 |
| | Polymerizable compound | Polymerizable compound (B)-1 | 95 | 85 | 15 | 5 | 45 | 45 |
| | Curing agent | Allyl compound | — | — | — | — | — | — |
| | | Methacrylate compound | — | — | — | — | — | — |
| | | Epoxy compound | — | — | — | — | 10 | — |
| | | Benzoxazine compound | — | — | — | — | — | 10 |
| | | Cyanate ester compound | — | — | — | — | — | — |
| | Reaction initiator | Organic peroxide | 0.5 | 0.5 | 0.5 | 0.5 | — | — |
| | Reaction accelerator | 2E4MZ | — | — | — | — | 0.1 | 1.0 |
| | | Zinc octanoate | — | — | — | — | — | — |
| | Inorganic filler | Silica | 150 | 150 | 150 | 150 | 150 | 150 |
| Evaluation | Glass transition temperature Tg (° C.) | | 230 | 245 | 295 | >300 | 270 | 265 |
| | Dielectric loss tangent | | 0.0019 | 0.0020 | 0.0028 | 0.0029 | 0.0025 | 0.0025 |
| | Coefficient of thermal expansion (ppm/° C.) | | 45 | 40 | 32 | 30 | 35 | 35 |

| | | | Example | | | Comparative Example | |
|---|---|---|---|---|---|---|---|
| | | | 15 | 16 | 17 | 4 | 5 |
| Composition (parts by mass) | Maleimide compound | Maleimide compound (A)-1 | — | — | — | 50 | 50 |
| | | Maleimide compound (A)-2 | 45 | 50 | 50 | — | — |
| | Polymerizable compound | Polymerizable compound (B)-1 | 45 | 50 | 50 | — | — |
| | Curing agent | Allyl compound | — | — | — | 50 | — |
| | | Methacrylate compound | — | — | — | — | 50 |
| | | Epoxy compound | — | — | — | — | — |
| | | Benzoxazine compound | — | — | — | — | — |
| | | Cyanate ester compound | 10 | — | — | — | — |
| | Reaction initiator | Organic peroxide | — | — | — | — | — |
| | Reaction accelerator | 2E4MZ | — | — | — | — | — |
| | | Zinc octanoate | 0.03 | — | — | — | — |
| | Inorganic filler | Silica | 150 | 65 | 300 | 150 | 150 |

TABLE 2-continued

| | | | | | | |
|---|---|---|---|---|---|---|
| Evaluation | Glass transition temperature Tg (° C.) | 275 | 270 | 270 | 170 | 270 |
| | Dielectric loss tangent | 0.0024 | 0.0025 | 0.0020 | 0.0035 | 0.0030 |
| | Coefficient of thermal expansion (ppm/° C.) | 35 | 45 | 30 | 50 | 45 |

As can be seen from Tables 1 and 2, in resin compositions containing a polymerizable compound having a carbon-carbon unsaturated double bond in the molecule and a proportion of the total mass of heteroatoms to the total mass of all constituent elements of 15% by mass or less, in the case of using resin compositions (Examples 1 to 17) containing a maleimide compound (maleimide compound (A)) that had a maleimide equivalent of 500 g/eq. or less, was solid at 25° C., and dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C., cured products having a higher glass transition temperature, a lower coefficient of thermal expansion, and a lower dielectric loss tangent were obtained as compared to the case of not using these resin compositions. Specifically, it was not possible to suitably produce a varnish of the resin composition according to Comparative Example 1, which is the same as the resin compositions according to Examples 1 to 4 except that the resin composition contained a maleimide compound (the maleimide compound (C)-1) that was not maleimide compounds (the maleimide compounds (A)-1 to (A)-4) that had a maleimide equivalent of 500 g/eq. or less, was solid at 25° C., and dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C. as a maleimide compound. It was possible to produce varnishes depending on the maleimide compounds (the maleimide compounds (C)-2 and (C)-3) in the case (Comparative Examples 2 and 3) of using maleimide compounds that were not maleimide compounds (the maleimide compounds (A)-1 to (A)-4) that had a maleimide equivalent of 500 g/eq. or less, was solid at 25° C., and dissolved at one or more concentration in a range of 40% by mass or more and less than 100% by mass as the concentration of the maleimide compound in a mixture of at least one selected from the group consisting of toluene and methyl ethyl ketone and the maleimide compound at 25° C. as well. The cured products obtained using the resin compositions according to Examples 1 to 4 had a higher glass transition temperature and a lower coefficient of thermal expansion as compared to the cured products obtained using such resin compositions according to Comparative Examples 2 and 3. The cured products obtained using the resin compositions according to Examples 1 to 4 had a lower coefficient of thermal expansion as compared to the cured products obtained using the resin compositions according to Comparative Examples 4 and 5, which were the same as the resin compositions according to Examples 1 to 4 except that the resin compositions did not contain a polymerizable compound having a carbon-carbon unsaturated double bond in the molecule and a proportion of the total mass of heteroatoms to the total mass of all constituent elements of 15% by mass or less but contained a compound having a proportion of the total mass of heteroatoms of more than 15% by mass. From Tables 1 and 2, it has been found that a cured product having a high glass transition temperature, a low dielectric loss tangent, and a low coefficient of thermal expansion is obtained when the kind of maleimide compound is changed, the kind of polymerizable compound is changed, the content of maleimide compound is changed, or a curing agent is further contained as well.

With regard to the resin compositions according to Examples 1 to 17 and Comparative Examples 1 to 5, the following evaluations were also additionally performed.

[Water Absorption]

The water absorption (%) was measured in conformity with IPC-TM-650 2.6.2.1 using an unclad substrate obtained by removing the copper foil from the evaluation substrate (metal-clad laminate) by etching as a test piece. As a result of the measurement, it was evaluated as “Very Good” when the water absorption was less than 0.2%, it was evaluated as “Good” when the water absorption was 0.2% or more and less than 0.3%, and it was evaluated as “Poor” when the water absorption was 0.3% or more. Specifically, Examples 1 to 6, 9, 10, and 17 and Comparative Examples 2 and 3 were evaluated as “Very Good”, Examples 11 and 13 to 16 were evaluated as “Good”, and Examples 7, 8, and 12 and Comparative Examples 4 and 5 were evaluated as “Poor”. From this fact, it has been found that not only the glass transition temperature is high, the dielectric loss tangent is low, and the coefficient of thermal expansion is low but also the water absorption is low when one of the polymerizable compounds 1 and 2 is used as the polymerizable compound and the content thereof is 15 parts by mass or more with respect to 100 parts by mass of the total mass of the maleimide compound and the polymerizable compound.

[Peel Strength]

The copper foil was peeled off from the evaluation substrate (metal-clad laminate), and the peel strength at that time was measured in conformity with JIS C 6481 (1996). Specifically, a pattern having a width of 10 mm and a length of 100 mm was formed on the evaluation substrate, the copper foil was peeled off at a speed of 50 mm/min using a tensile tester, and the peel strength (N/mm) at that time was measured. As a result of the measurement, it was evaluated as “Very Good” when the peel strength was 0.4 N/mm or more, it was evaluated as “Good” when the peel strength was 0.3 N/mm or more and less than 0.4 N/mm, and it was evaluated as “Poor” when the peel strength was less than 0.3 N/mm. Specifically, Examples 8, 14, 15, and 17 and Comparative Examples 2 and 3 were evaluated as “Very Good”, Examples 1 to 7, 12, 13, and 15 and Comparative Example 5 were evaluated as “Good”, and Examples 9, 10, and 17 and Comparative Example 4 were evaluated as “Poor”. From this fact, there is a tendency that not only the glass transition temperature is high, the dielectric loss tangent is low, the coefficient of thermal expansion is low but also the peel strength is high when the content of the polymerizable compound is a certain value or less, for example, 50 parts by mass or less with respect to 100 parts by mass of the total mass of the maleimide compound and the polymerizable compound and the content of the inorganic filler is a certain value or less, for example, 150 parts by mass or less.

This application is based on Japanese Patent Application No. 2020-153181 filed on Sep. 11, 2020, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a resin composition, which affords a cured product exhibiting excellent low dielectric properties and heat resistance and a low coefficient of thermal expansion. In addition, according to the present invention, a prepreg, a film with resin, a metal foil with resin, a metal-clad laminate, and a wiring board which are obtained using the resin composition are provided.

The invention claimed is:

1. A resin composition comprising:

a maleimide compound (A) that has a maleimide equivalent of 500 g/eq. or less, is solid at 25° C., and dissolves at one or more concentration in a range of 40% by mass or more and less than 100% by mass as a concentration of the maleimide compound in a mixture of at least one selected from the group consisting of toluene and methyl ethyl ketone and the maleimide compound at 25° C.; and a polymerizable compound (B) having a carbon-carbon unsaturated double bond in a molecule and a proportion of a total mass of heteroatoms to a total mass of all constituent elements of 15% by mass or less;

wherein the maleimide compound (A) includes a maleimide compound (A2) having an indane structure in a molecule.

2. The resin composition according to claim 1, wherein the polymerizable compound (B) includes at least one of a polyphenylene ether compound (B1) having a carbon-carbon unsaturated double bond in a molecule and a hydrocarbon-based compound (B2) having a carbon-carbon unsaturated double bond in a molecule.

3. The resin composition according to claim 2, wherein the hydrocarbon-based compound (B2) includes a compound represented by the following Formula (1):

(1)

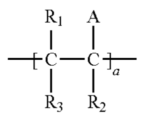

wherein in Formula (1), $R_1$ to $R_3$ each independently represent a hydrogen atom or an alkyl group, and A represents a hydrogen atom, an alkyl group, an alkenyl group, or a group represented by the following Formula (2), and a represents 1 to 1000:

(2)

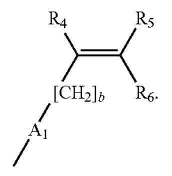

wherein in Formula (2), $R_4$ to $R_6$ each independently represent a hydrogen atom or an alkyl group, $Ar_1$ represents an arylene group, and b represents 0 to 1.

4. The resin composition according to claim 3, wherein a compound (B3) represented by Formula (1) includes a compound containing at least one of a group represented by the following Formula (7) and a group represented by the following Formula (8) as the group represented by Formula (2) in a molecule:

(7)

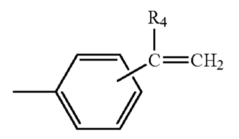

(8)

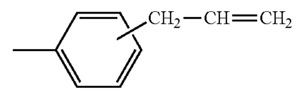

wherein in Formula (7), $R_4$ represents a hydrogen atom or an alkyl group.

5. The resin composition according to claim 1, wherein the maleimide compound (A) further includes a maleimide compound (A1) having an arylene structure bonded in meta-orientation in a molecule.

6. The resin composition according to claim 5, wherein the maleimide compound (A1) having an arylene structure bonded in meta-orientation in a molecule includes a maleimide compound (A3) represented by the following Formula (3):

(3)

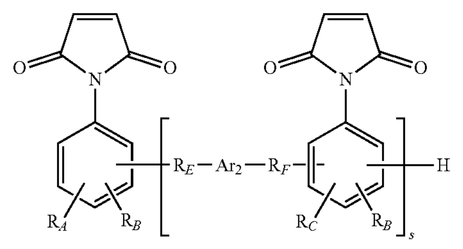

wherein in Formula (3), $Ar_2$ represents an arylene group bonded in meta-orientation, $R_A$, $R_B$, $R_C$, and $R_D$ each independently represent a hydrogen atom, an alkyl group having 1 to 5 carbon atoms, or a phenyl group, $R_E$ and $R_F$ each independently represent an aliphatic hydrocarbon group, and s represents 1 to 5.

7. The resin composition according to claim 6, wherein the maleimide compound (A3) represented by Formula (3) includes a maleimide compound (A4) represented by the following Formula (4):

(4)

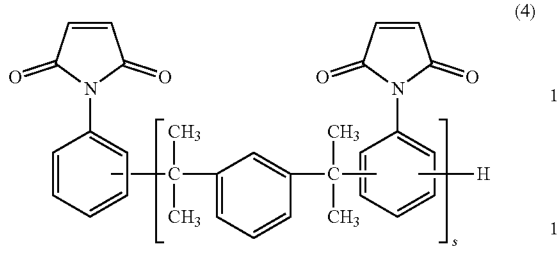

wherein in Formula (4), s represents 1 to 5.

8. The resin composition according to claim 7, wherein the maleimide compound having a structure represented by Formula (5) in a molecule includes a maleimide compound (A5) represented by the following Formula (6):

(6)

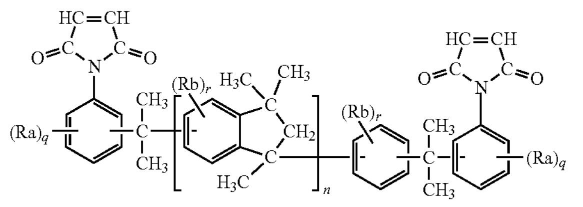

wherein in Formula (6), "Ra" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group, "Rb" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxyl group, or a mercapto group, q represents 0 to 4, r represents 0 to 3, and n represents 0.95 to 10.

9. The resin composition according to claim 1, wherein the indane structure includes a structure represented by the following Formula (5):

(5)

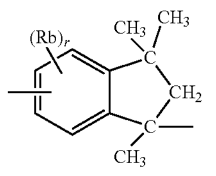

wherein in Formula (5), "Rb" represents an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a hydroxyl group, or a mercapto group, and r represents 0 to 3.

10. The resin composition according to claim 1, wherein a proportion of a total mass of heteroatoms to a total mass of all constituent elements is 10% by mass or less in the polymerizable compound (B).

11. The resin composition according to claim 1, wherein a content of the polymerizable compound (B) is 10 to 90 parts by mass with respect to 100 parts by mass of a total mass of the maleimide compound (A) and the polymerizable compound (B).

12. The resin composition according to claim 1, further comprising a curing agent that reacts with at least one of the maleimide compound (A) and the polymerizable compound (B).

13. The resin composition according to claim 1, further comprising an inorganic filler.

14. The resin composition according to claim 13, wherein the inorganic filler includes silica.

15. The resin composition according to claim 13, wherein a content of the inorganic filler is 10 to 250 parts by mass with respect to 100 parts by mass of a total mass of the maleimide compound (A) and the polymerizable compound (B).

16. The resin composition according to claim 1, further comprising a flame retardant.

17. A prepreg comprising:

the resin composition according to claim 1 or a semi-cured product of the resin composition; and a fibrous base material.

18. A metal-clad laminate comprising:

an insulating layer containing a cured product of the prepreg according to claim 17; and a metal foil.

19. A wiring board comprising:

an insulating layer containing a cured product of the prepreg according to claim 17; and wiring.

20. A film with resin comprising:

a resin layer containing the resin composition according to claim 1 or a semi-cured product of the resin composition; and a support film.

21. A metal foil with resin comprising:

a resin layer containing the resin composition according to claim 1 or a semi-cured product of the resin composition; and a metal foil.

22. A metal-clad laminate comprising:

an insulating layer containing a cured product of the resin composition according to claim 1; and a metal foil.

23. A wiring board comprising:

an insulating layer containing a cured product of the resin composition according to claim 1; and wiring.

* * * * *